United States Patent
Miyashita et al.

(10) Patent No.: US 10,340,224 B2
(45) Date of Patent: Jul. 2, 2019

(54) MICROWAVE AND MILLIMETER WAVE PACKAGE

(71) Applicant: Mitsubishi Electric Corporation, Tokyo (JP)

(72) Inventors: Miyo Miyashita, Tokyo (JP); Kazuya Yamamoto, Tokyo (JP); Hiroaki Maehara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/212,525

(22) Filed: Jul. 18, 2016

(65) Prior Publication Data

US 2017/0141047 A1    May 18, 2017

(30) Foreign Application Priority Data

Nov. 16, 2015 (JP) ................................. 2015-223846

(51) Int. Cl.
    *H01L 23/552* (2006.01)
    *H01L 23/48* (2006.01)
    (Continued)

(52) U.S. Cl.
    CPC .......... *H01L 23/552* (2013.01); *H01L 23/481* (2013.01); *H01L 23/4924* (2013.01);
    (Continued)

(58) Field of Classification Search
    USPC ....................................................... 257/695
    See application file for complete search history.

(56) References Cited

U.S. PATENT DOCUMENTS 5,602,421 A * 2/1997 Li .......................... H01L 23/057
    257/664
5,723,904 A * 3/1998 Shiga ...................... H01L 23/04
    257/698
(Continued)

FOREIGN PATENT DOCUMENTS

JP    H3-106058 A    5/1991
JP    05-083010 A    4/1993
(Continued)

OTHER PUBLICATIONS

EBook "https://soundphysics.ius.edu/?page_id=1094".*
(Continued)

*Primary Examiner* — Marc Anthony Armand
*Assistant Examiner* — Sue Tang
(74) *Attorney, Agent, or Firm* — Studebaker & Brackett PC

(57) ABSTRACT

A package includes a conductor base plate having a element fixed to an upper surface thereof, a side wall provided on the conductor base plate to surround the element, the side wall having a conductor portion electrically connected to the conductor base plate, a dielectric cap disposed on the side wall, a front-side metal film provided on an outer surface of the dielectric cap, a first back-side metal film provided on an inner surface of the dielectric cap such that a center of the first back-side metal film approximately coincides with a center of a surface of the dielectric cap which faces the conductor base plate, and a plurality of vias passing through the dielectric cap to achieve electrical connection between the front-side metal film and the first back-side metal film and between the front-side metal film and the conductor portion oldie side wall.

6 Claims, 19 Drawing Sheets

(51) Int. Cl.
*H01L 23/492* (2006.01)
*H01L 23/66* (2006.01)

(52) U.S. Cl.
CPC ...... *H01L 23/66* (2013.01); *H01L 2223/6616* (2013.01); *H01L 2223/6655* (2013.01); *H01L 2224/48091* (2013.01); *H01L 2924/16195* (2013.01)

(56) References Cited

U.S. PATENT DOCUMENTS

| | | | | |
|---|---|---|---|---|
| 7,196,598 B2 * | 3/2007 | Maruhashi | ............ | H01P 1/2088 333/212 |
| 2007/0007647 A1 | 1/2007 | Takagi | | |
| 2010/0060373 A1 | 3/2010 | Takagi | | |
| 2011/0051375 A1 * | 3/2011 | Ammar | ................ | H01L 23/552 361/728 |
| 2015/0021748 A1 * | 1/2015 | Sasaki | .................... | H01L 23/66 257/664 |

FOREIGN PATENT DOCUMENTS

| | | |
|---|---|---|
| JP | 06-224317 A | 8/1994 |
| JP | 09-148470 A | 6/1997 |
| JP | 2000-236045 A | 8/2000 |
| JP | 2010-087469 A | 4/2010 |
| JP | 4575247 B2 | 8/2010 |
| JP | 2012-195329 A | 10/2012 |
| JP | 5377096 B2 | 10/2013 |
| JP | 2015-23194 A | 2/2015 |

OTHER PUBLICATIONS

An Office Action issued by the State Intellectual Property Office dated Oct. 12, 2018, which corresponds to Chinese Patent Application No. 201611007713.6 and is related to U.S. Appl. No. 15/212,525 with English translation.

An Office Action; "Notification of Reasons for Refusal," issued by the Japanese Patent Office dated Sep. 25, 2018, which corresponds to Japanese Patent Application No. 2015-223846 and is related U.S. Appl. No. 15/212,525; with English Translation.

* cited by examiner

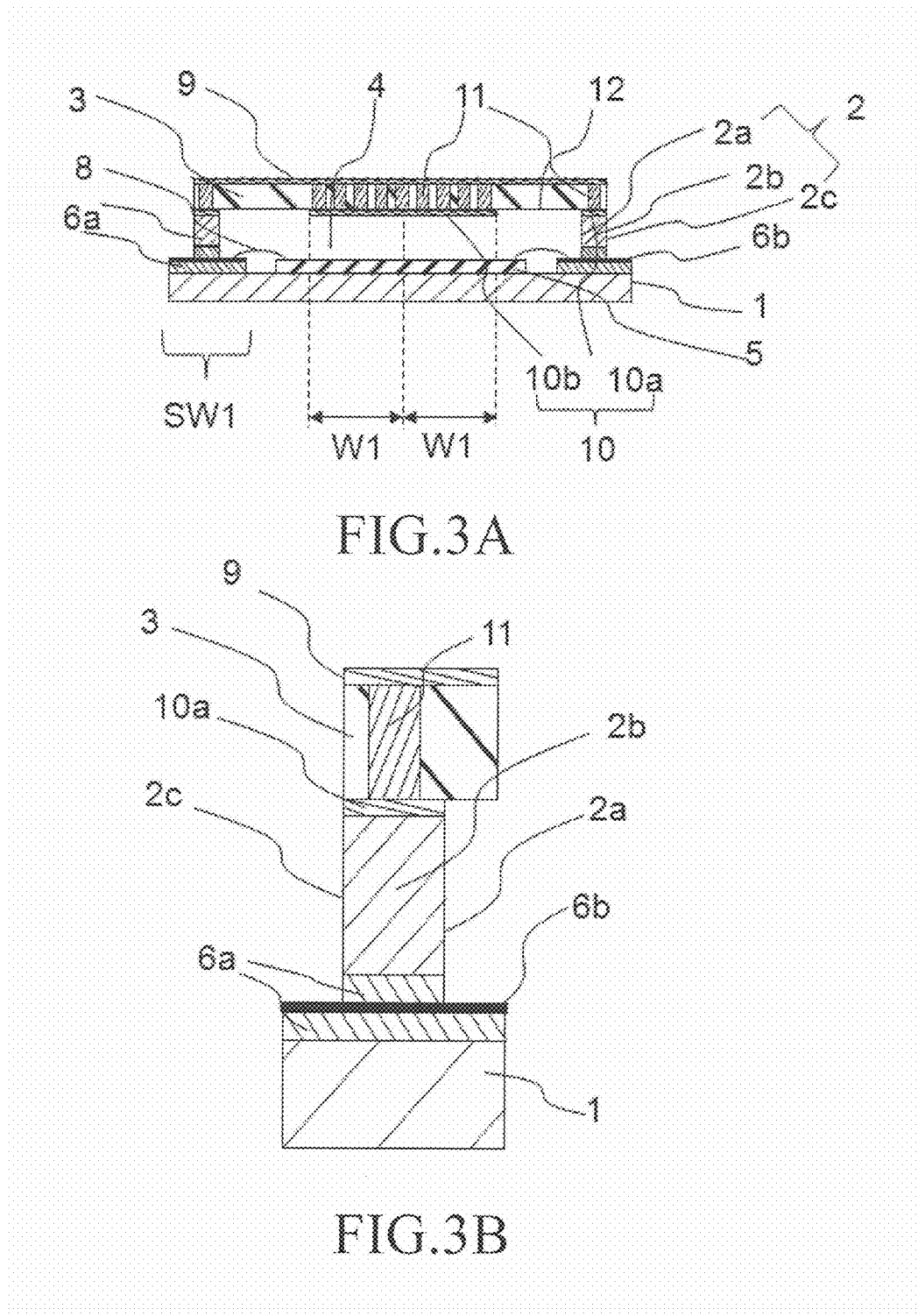

MICROWAVE AND MILLIMETER WAVE PACKAGE

BACKGROUND OF THE INVENTION

Field of the Invention

The present invention relates to a package suitable for a semiconductor device used in the microwave band and the millimeter wave band.

Background Art

A semiconductor package used in the microwave band and the millimeter wave band has a structure in which a circuit substrate having a semiconductor element, a matching circuit, and the like mounted thereon is mounted on a planar portion in a cavity of the package, and has a cavity resonant frequency depending on dimensions (e.g., depth, width, and height) of the cavity portion (e.g., see Japanese Patent Application Publications Nos. H5-83010 and 2000-236045, Japanese Patent No. 5377096, and Japanese Patent Application Publication No. H9-148470). For simplicity, microwaves and millimeter waves will hereinafter be generically referred to as high-frequency waves. In the case where this cavity resonant frequency and an operation frequency band of the high-frequency package overlap or come close to each other, this results in undesired oscillations caused by deterioration in isolation between input and output terminals, a dip (discontinuous depression) in bandpass characteristics within the operation frequency band, a reflection gain, and the like. Thus, it becomes difficult to obtain desired high-frequency characteristics.

Generally, semiconductor packages used in the microwave band and the millimeter wave band are designed with minimum sizes from the viewpoint of size and cost reduction. In the case where a high-frequency circuit mounted in a package has a relatively low output power and a relatively low operation frequency band, the package-specific cavity resonant frequency is sufficiently high relative to the operation frequency band. However, since package dimensions have increased in accordance with recent demands for higher output power and higher frequencies, the cavity resonant frequency has decreased, and has begun to often come close to or overlap the operation frequency band of the high-frequency circuit.

Dimensions of a package are roughly determined by dimensions of a high-frequency circuit to be mounted, e.g., dimensions of a semiconductor element, and dimensions of substrates of an input/output dividing and combining circuit and a matching circuit. As an example, in packages for mounting 100 W-class output power amplifiers in the 12 GHz band, the 14 GHz band, and the 18 GHz band in which frequencies are relatively close to each other, package dimensions are roughly equal. However, since the above-described problem that the cavity resonant frequency comes close to or overlap the operation frequency band often occurs, optimum package dimensions and a cavity's internal structure must heretofore be selected for each frequency band. Thus, there has been a problem that package development periods become long or that cost reduction is inhibited.

In recent years, from the viewpoint of cost reduction, attention is focused on a trend toward increasing the replacement of metal by dielectrics typified by ceramics in part of package material. One typical example is an example in which a lid (hereinafter referred to as a cap) and a side wall of a package are made of a dielectric material (e.g., see Japanese Patent No. 5377096 and Japanese Patent Application Publication No. 119-148470). In the case where a front side or a back side (cavity side) of a dielectric cap is fully covered with a metal layer by plating or the like, an electromagnetic shielding effect can be maintained as in the case where a metal cap is used, and a high-frequency circuit mounted in the package can operate with no influence of the environment outside the package. However, a dielectric cap has a higher permittivity than air and therefore acts in the direction of decreasing the cavity resonant frequency. Accordingly, in the case where the operation frequency band and the cavity resonant frequency specific to dimensions of the package are close to each other, the dielectric cap needs to be used with particular care.

In view of the above-described technical background, some measures have heretofore been disclosed. In Japanese Patent Application Publication No. H5-83010, to cope with a decrease in a cavity resonant frequency associated with an increase in package dimensions, an electromagnetic shield wall is provided in a package to divide a cavity. As a result, dimensions of individual cavities become small, and a decrease in the cavity resonant frequency can be reduced. However, there has been a problem that the shield wall significantly limits a method of mounting a semiconductor element in a package and dimensions of a circuit substrate.

In Japanese Patent Application Publication No. 2000-236045, a method is described in which a protruding portion is provided in a central portion of a metal cap to reduce a decrease in a cavity resonant frequency. However, this method has a problem that the height of the cap increases and that machining cost for deforming the cap increases.

Japanese Patent No. 5377096 and Japanese Patent Application Publication No. H9-148470 show examples in which an opening portion is provided in part of a metal film on a cavity-side surface of a dielectric cap made of a ceramic or the like to reduce a decrease in a cavity resonant frequency caused by the dielectric cap and reduce electromagnetic coupling between a wire for mounting a semiconductor element or a circuit substrate in the package and a metal film on an inner side of the dielectric cap.

However, in Japanese Patent No. 5377096 and Japanese Patent Application Publication No. H9-148470, in the case where a metal film is provided on not only the cavity side of the dielectric cap but also a front side thereof and where the metal film is connected to conductor portions of a bottom and a side wall of the package to provide complete electromagnetic shielding in the upward direction from the package, resonances determined by dimensions of the dielectric cap newly occur, and there has been a problem that the newly occurring high-order-mode resonances enter the operation frequency band.

SUMMARY OF THE INVENTION

An object of the present invention is to provide means for widening a bandwidth of a high-frequency package with a dielectric cap by increasing a difference between lowest-order and second-lowest-order cavity resonant frequencies specific to the package while reliably realizing electromagnetic shielding in the direction of an upper surface of the package with a metal film provided on a front side of the dielectric cap.

The features and advantages of the present invention may be summarized as follows.

According to one aspect of the present invention, a microwave and millimeter wave package includes a conductor base plate having a semiconductor element fixed to an upper surface thereof, a side wall provided on the conductor base plate to surround the semiconductor element, the side wall having a conductor portion electrically connected to the conductor base plate, a dielectric cap disposed on the side wall to form an internal space together with the conductor base plate and the side wall, a front-side metal film provided on an outer surface of the dielectric cap, a first back-side metal film provided on an inner surface of the dielectric cap such that a center of the first back-side metal film approximately coincides with a center of a surface of the dielectric cap which faces the conductor base plate, and a plurality of vias provided to pass through the dielectric cap and achieve electrical connection between the front-side metal film and the first back-side metal film and electrical connection between the front-side metal film and the conductor portion of the side wall.

Other and further objects, features and advantages of the invention will appear more fully from the following description.

BRIEF DESCRIPTION OF THE DRAWINGS

FIG. 3A is a cross-sectional view taken along line X1-X1 shown in FIG. 2;

FIG. 3B is an enlarged view of part SW1;

DETAILED DESCRIPTION OF THE PREFERRED EMBODIMENTS

High-frequency packages according to embodiments of the present invention will be described. The same or corresponding components will be denoted by the same reference signs, and the repetition of explanation thereof may be omitted.

Embodiment 1

(Explanation of Structure)

Figure 1:
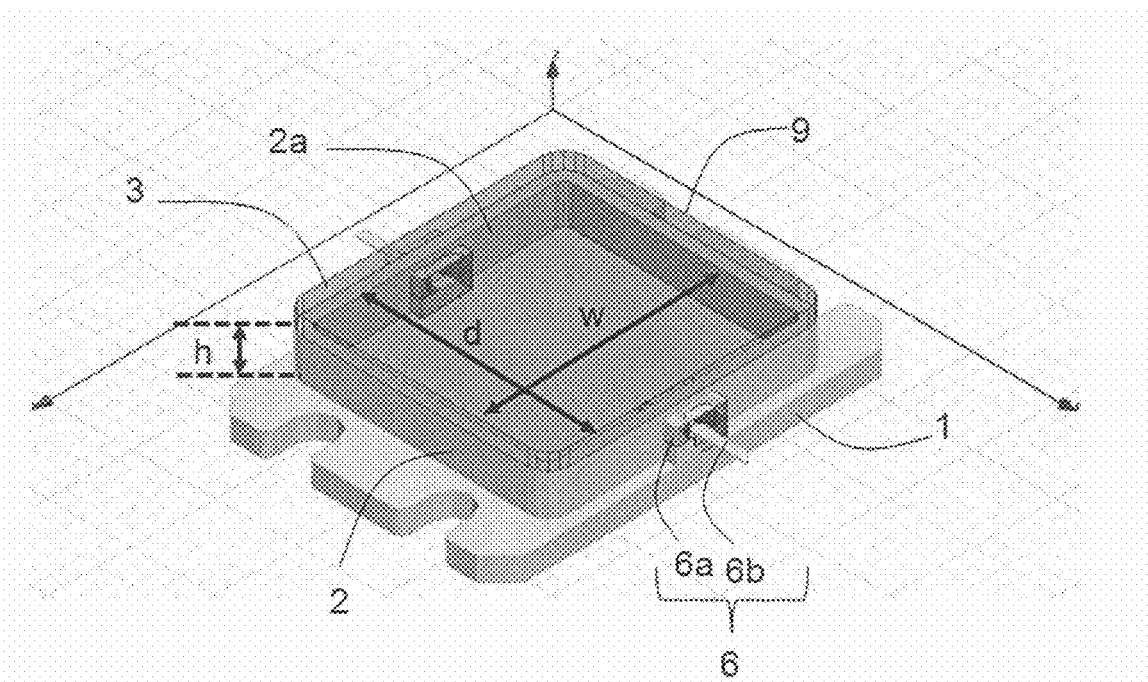
FIG. 1 is a perspective view showing a high-frequency package of embodiment 1.
Figure 2:
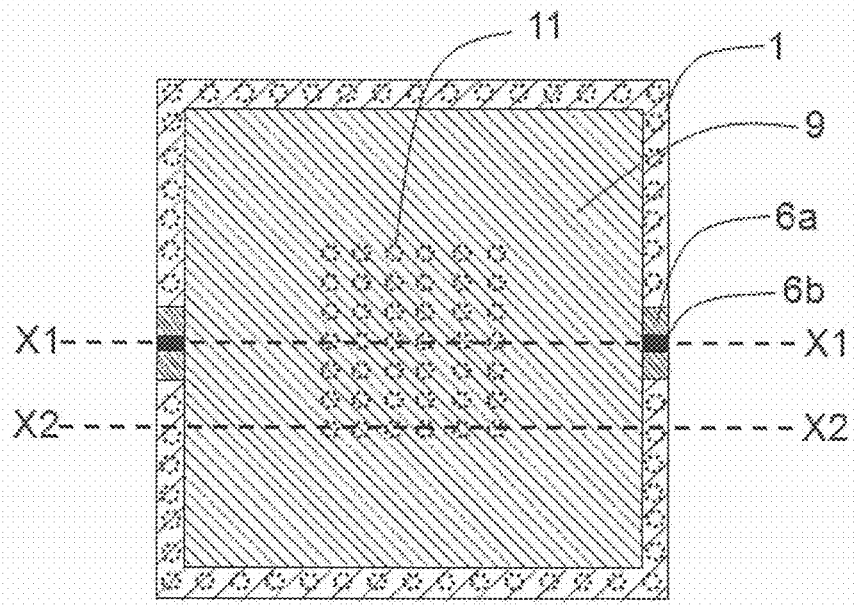
FIG. 2 is a plan view of the high-frequency package according to embodiment 1 as seen from above.
Figure 4A:
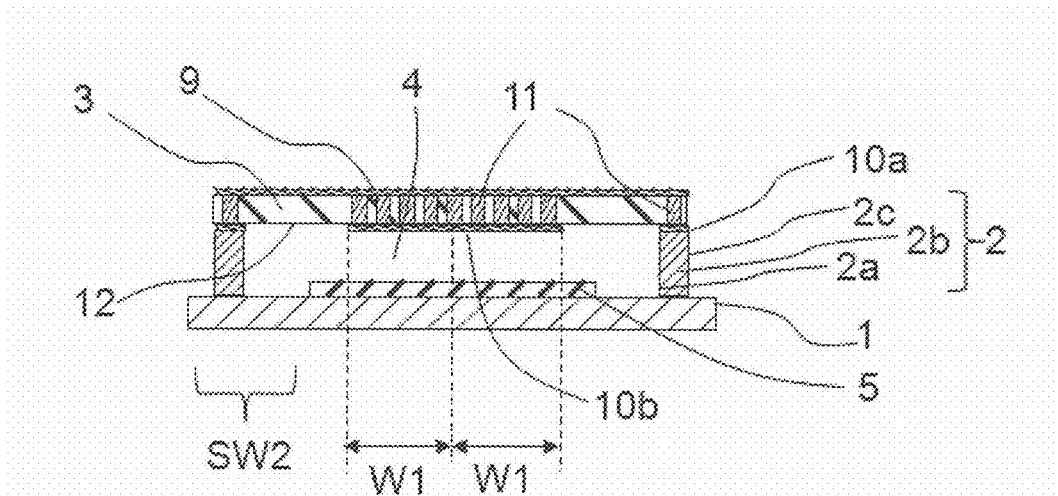
FIG. 4A is a cross-sectional view taken along line X2-X2 shown in FIG. 2.
Figure 4B:
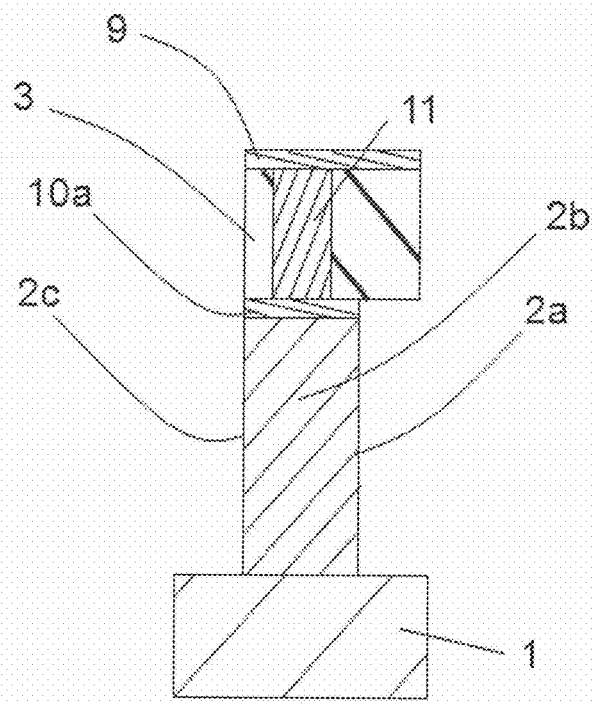
FIG. 4B is an enlarged view of part SW2.

FIG. 1 is a perspective view showing a high-frequency package of embodiment 1 of the present invention. FIG. 2 is a plan view of the high-frequency package according to embodiment 1 as seen from above. FIG. 3A is a cross-sectional view taken along line X1-X1 shown in FIG. 2, and FIG. 3B is an enlarged view of part SW1 around a side wall of FIG. 3A. FIG. 4A is a cross-sectional view taken along line X2-X2 shown in FIG. 2, and FIG. 4B is an enlarged view of part SW2 around a side wall of FIG. 4A. FIG. 5 shows a specific example of the configuration of a side wall. FIG. 6 is a plan view of a back side (surface on a cavity side when attached to the package) of a dielectric cap according to embodiment 1.

In FIGS. 1 to 4, 1 denotes a conductor base plate, 2 denotes the entire side wall of the package, 2a denotes an inner surface of the side wall of the package, 2b denotes an inner portion of the side wall, 2c denotes an outer surface of the side wall, 3 denotes a dielectric cap, 4 denotes a cavity portion, 5 denotes a semiconductor element, 6 denotes a feedthrough portion, 6a denotes a dielectric of the feedthrough portion, 6b denotes a signal line conductor of the feedthrough portion, 8 denotes a wire electrically connecting the semiconductor element 5 and the signal line conductor 6b of the feedthrough portion, and 9 denotes a metal film provided on a front side of the dielectric cap 3.

Figure 5A:
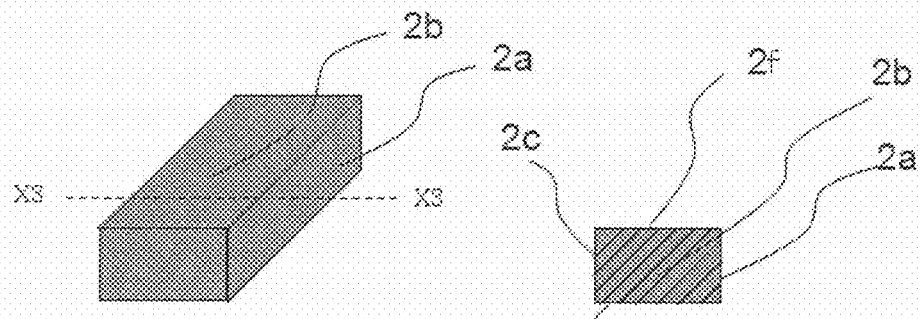
FIG. 5A shows side wall entirely made of conductor.
Figure 5B:
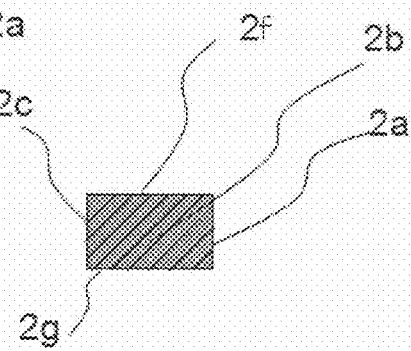
FIG. 5B is a cross-sectional view taken along line X3-X3 shown in FIG. 5A.
Figure 5C:
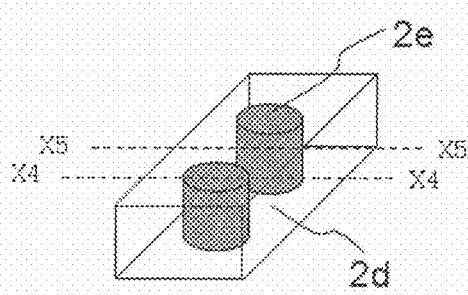
FIG. 5C shows side wall made of dielectric and conductive vias.
Figure 5D:
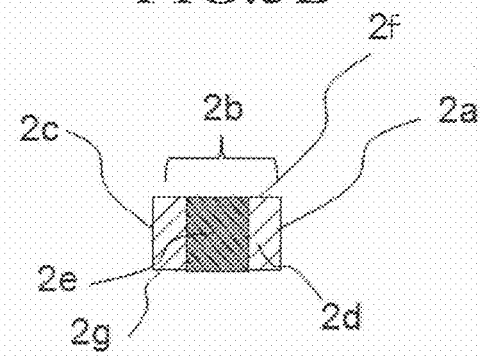
FIG. 5D is a cross-sectional view taken along line X4-X4 shown in FIG. 5C.
Figure 5E:
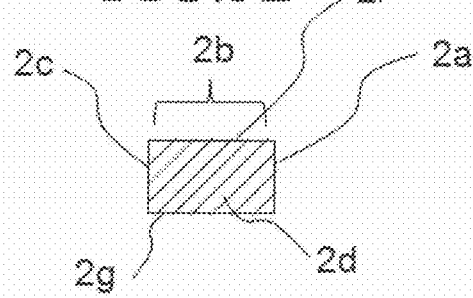
FIG. 5E is a cross-sectional view taken along line X5-X5 shown in FIG. 5C.
Figure 6:
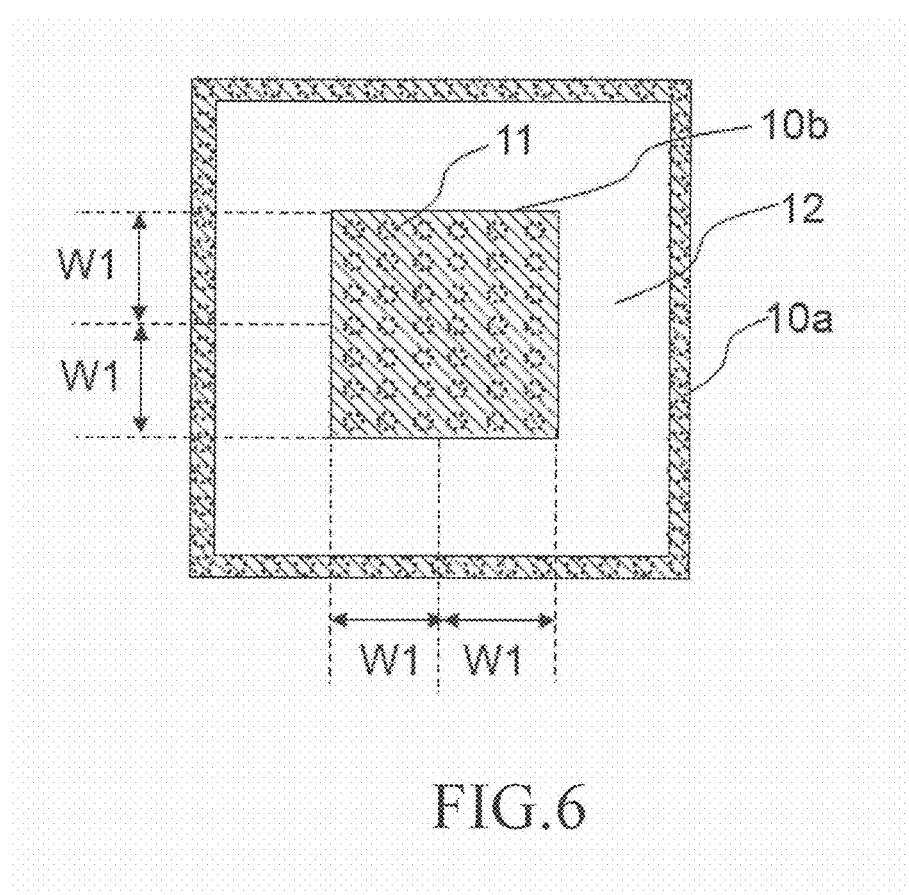
FIG. 6 is a plan view of a back side of a dielectric cap according to embodiment 1.

Examples of the side wall 2 include a side wall entirely made of a conductor as shown in FIG. 5A and FIG. 5B, and a side wall having conductive vias 2e passing through a dielectric 2d typified by a ceramic from an upper surface 2f to a lower surface 2g as shown in FIG. 5C, FIG. 5D, and FIG. 5E. In the examples shown in FIG. 5C, FIG. 5D, and FIG. 5E, a metal film may be provided by plating so as to cover the upper surface 2f, the lower surface 2g, the inner surface 2a, and the outer surface 2c.

Hereinafter, a conductor portion or portions of the side wall 2 mean the entire side wall 2 in the example of FIG. 5A, and the vias 2e or the metal film provided to cover the upper surface 2f, the lower surface 2g, the inner surface 2a, and the outer surface 2c in the example of FIG. 5C.

The metal films 10 are metal films provided on the back side of the dielectric cap 3. Reference sign 10a denotes a metal film portion fixed to the side wall 2 with a conductive adhesive or the like and provided for electrical connection with the conductor base plate 1 through the conductor portion of the side wall 2, and the width of the metal film is not more than the thickness of the side wall 2. Reference sign 10b denotes a back-side metal film of the dielectric cap 3, and separated from the metal film 10a connected to the side wall by a dielectric-exposed portion 12 on the back side as shown in FIG. 6.

The back-side metal film 10b are electrically connected a front-side metal film 9 of the dielectric package 3 through the plurality of vias 11, and the front-side metal film 9 is electrically connected to the conductor portion of the side wall 2 through the plurality of vias 11 and the metal film 10a. Specifically, the metal films 9, 10a, and 10b are electrically connected to the conductor base plate 1. Reference sign 12 denotes a dielectric-exposed portion provided between the metal films 10a and 10b. Here, the back-side metal film 10b is formed to be symmetric with respect to a line such that a center of a rectangle of the metal film 10b approximately coincides with a center of the dielectric cap 3 as shown in FIG. 6.

The conductor base plate 1 having a conductor surface to which the semiconductor element 5 is grounded and fixed is made of conductive metal, e.g., copper, copper-tungsten alloy, molybdenum, copper-molybdenum alloy, Kovar, or the like. The side wall 2 having a conductor portion electrically connected to the conductor surface of the conductor base plate 1 is bonded to the conductor base plate 1 by brazing or with a conductive adhesive or the like to form a space in which the semiconductor element 5 is mounted. The semiconductor element 5 is usually fixed to a grounding conductor surface of the conductor base plate 1 in the space surrounded by the side wall 2 by soldering or with a conductive resin or the like. FIGS. 3 and 4 show the case where only the semiconductor element 5 is mounted in the cavity 4, but an input/output dividing circuit substrate, a matching circuit substrate, and the like for the semiconductor element 5 may also be mounted in addition to the semiconductor element 5.

The feedthrough portion 6 has a structure in which the signal line conductor 6b is fixed in place by being sandwiched between the dielectrics 6a, and is fitted into an opening of the side wall 2 which has been formed in a size appropriate for the feedthrough portion 6 in advance (see FIG. 1 of Japanese Patent No. 5377096). Inside the side wall 2, the signal line conductors 6b of the feedthrough portions 6 and the semiconductor element 5 are electrically connected with gold wires 8 or the like to form input/output signal terminals. The dielectric cap 3 using a dielectric (e.g., ceramic, epoxy resin, or the like) having a higher permittivity than gas (e.g., air, nitrogen gas, or the like) filling the cavity portion 4 is electrically connected to the conductor base plate 1 through the conductor portion of the side wall 2 by fixing the metal film 10a provided on the back side (cavity-side surface) by plating or the like and the side wall 2 to each other with a conductive adhesive or the like. Meanwhile, the front-side metal film 9 of the dielectric cap 3 formed by plating or the like is electrically connected to the back-side metal films 10a and 10b through the plurality of vias 11 having insides thereof filled with metal or having surfaces thereof plated.

With the above-described electrical connections, the high-frequency package shown in FIGS. 2 to 6 has a structure in which the front-side metal film 9 electrically connected to the conductor base plate 1 provides complete electromagnetic shielding at least in the direction of the upper surface of the package. Accordingly, even if another metallic body is placed near and above the package when the package is mounted on a circuit substrate or the like, the metallic body has no effect on characteristics of the high-frequency circuit in the package.

(Relationship between the Back-Side Metal Film of the Dielectric Cap and the Resonant Frequency)

Next, a general explanation of a cavity resonant frequency will be made, and features of embodiment 1 will then be described. Resonance in a rectangular cavity surrounded by metals caused by the formation of a standing wave between opposite surfaces as discussed in, for example, Robert E. Collin, "Foundations for Microwave Engineering." In the high-frequency package of embodiment 1, in the case where the area of the semiconductor element 5 to be mounted becomes large due to an increase in output power, dimensions of the depth (d) and the width (w) of a region on the conductor base plate 1 surrounded by the side wall 2 may be increased. Compared to these dimensions, the height (h) of the package including the dielectric cap 3 is generally sufficiently small. Accordingly, calculating resonant frequencies in the cavity portion practically only requires consideration of standing waves formed between opposite surfaces of the side wall 2.

Figure 7:
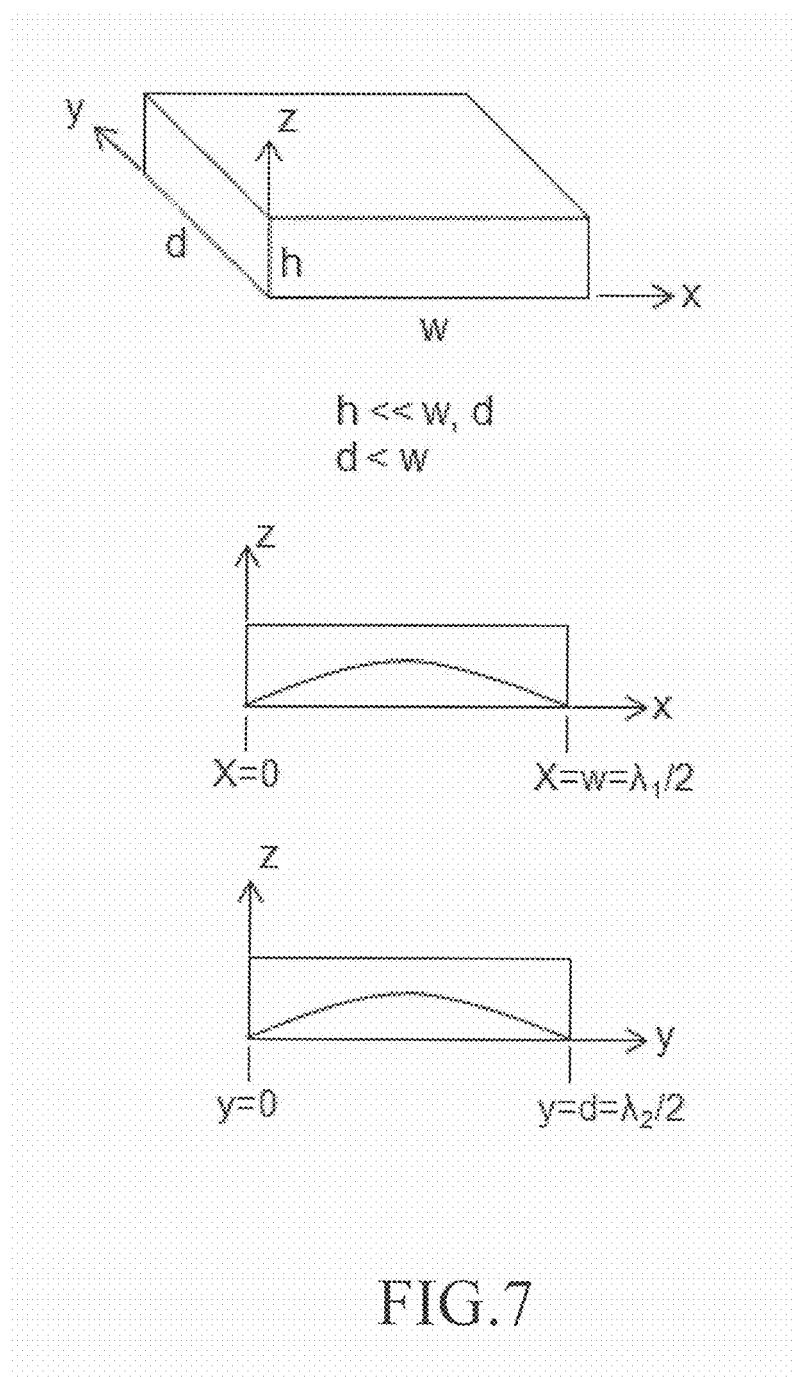
FIG. 7 shows a standing wave for a lowest-order resonance in a rectangular cavity.
Figure 8A:
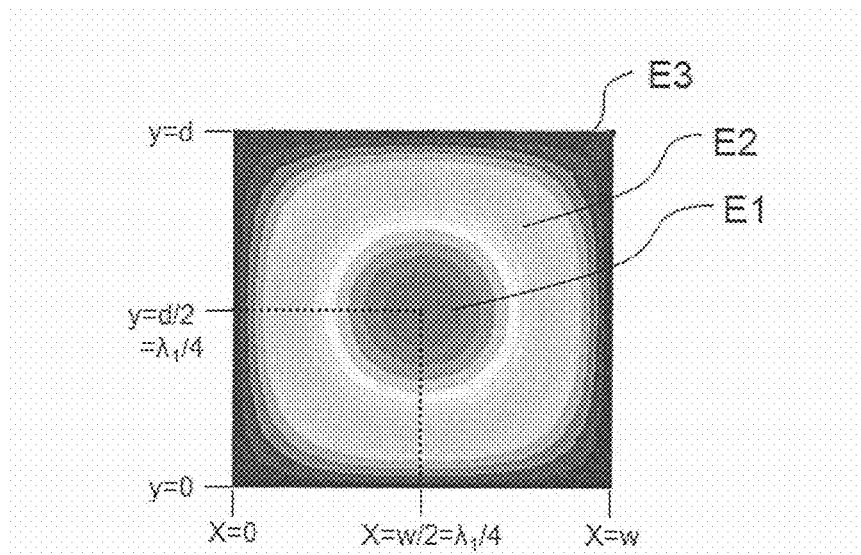
FIG. 8A shows an example of an electric field distribution for the lowest-order resonance in the rectangular cavity.

FIG. 7 shows a standing wave for a lowest-order resonance in a cavity defined by a width w, a depth d, and a height h. In this drawing, on the assumption that dimensions have the relationships d<w and h<<w, d, the lowest-order resonance occurs in the case where a standing wave for a fundamental oscillation having nodes at opposite surfaces of the side wall 2 occurs. FIG. 8A shows an example of an electric field distribution for the resonance shown in FIG. 7. In FIG. 8A, a moderately dark region denoted by E1 has a highest electric field intensity, and a darkest region denoted by E3 has a lowest electric field intensity. Further, a near-white gray portion denoted by E2 has an electric field intensity between those of E1 and E3. From FIG. 8A, a highest electric field portion (region of E1) for the resonance is located right at the center of the region surrounded by the side wall 2, which is expressed in terms of coordinates as $(x, y)=(w/2, d/2)$. The coordinates can be expressed as $\lambda/4$ of a standing wave ($\lambda$ is one wavelength of a cavity resonant frequency) if wavelengths of standing waves are expressed as $\lambda 1=2w$ and $\lambda 2=2d$.

Figure 8B:
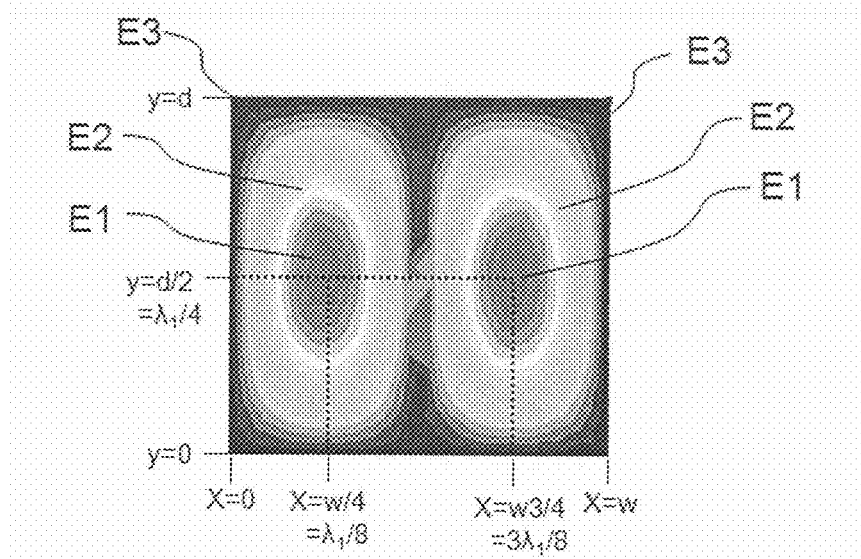
FIG. 8B shows an example of an electric field distribution for the resonance occurring as a resonance which is one order higher than the lowest-order resonance in the rectangular cavity.

Next, a second-order resonance occurring as a resonance which is one order higher than the lowest-order resonance will be described. FIG. 8B shows an example of an electric field distribution for a resonance occurring as a resonance which is one order higher than the lowest-order resonance. Meanings of electric field intensities of E1 to E3 shown in FIG. 8B are the same as the foregoing. Since d<w in FIG. 7, a resonance which is one order higher than the lowest order involves a standing wave for a second harmonic oscillation with respect to the x direction and a standing wave for a fundamental oscillation with respect to the y direction. For the above-described resonance, two highest electric field portions exist and are located away from opposite surfaces of the side wall 2 by ¼ of a distance w between the opposite surfaces, i.e., $\lambda/8$, toward the center of the package with respect to the x direction. Further, a resonance which is one order higher than this resonance involves a standing wave for a fundamental oscillation with respect to the x direction and a standing wave for a second harmonic oscillation with respect to the y direction. In this case, highest electric field portions are located away from opposite surfaces of the side wall 2 by ¼ of a distance w between the opposite surfaces, i.e., $\lambda 8$, toward the center of the package with respect to the y direction.

As described above, the position of a highest electric field portion differs according to the order of a resonance. An amount of change in the cavity resonant frequency caused by the insertion of a dielectric into the cavity also depends on the intensity of the electric field at the insertion position of the dielectric. Accordingly, in FIG. 5, the amount of change can be adjusted by changing the relationship between the position of the metal film opening portion 12 on the back side of the dielectric cap 3 and an electric field distribution at that position.

Figure 9A:
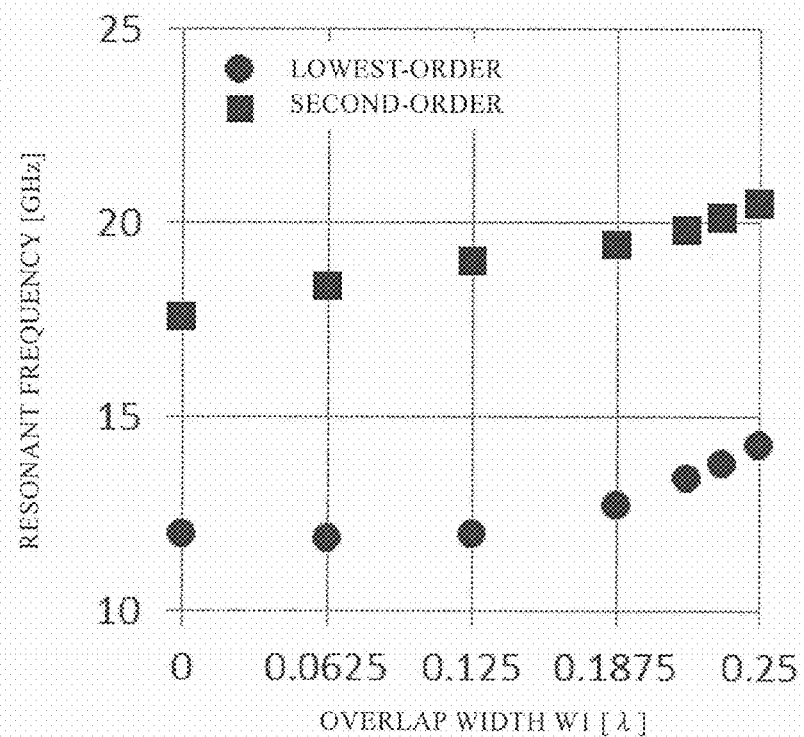
FIG. 9A shows an example of calculation about a change in the cavity resonant frequency caused by a change in the overlap width W1 between the back-side metal film of the dielectric cap and the cavity.

FIG. 9A shows an example of calculation about a change in the cavity resonant frequency caused by a change hi the overlap width W1 (described in FIGS. 3 to 5) between the back-side metal film 10b of the dielectric cap 3 and the cavity 4. In the calculation, dimensions of the inner surface 2a of the side wall are the depth d=14.3 mm, the width w=15.2 mm, and the height h=2.4 mm, and the relative permittivity of the dielectric cap 3 having a thickness of 1 mm is 9. A target of the operation frequency band of the package is a wide band from 12 GHz to 18 GHz. In the drawings, a closed circle represents a lowest-order cavity resonant frequency, and a closed square represents a cavity resonant frequency which is one order higher than the lowest order (second order). Moreover, the horizontal axis represents the overlap width W1 between the back-side metal film 10b and the cavity 4, and W1 is normalized by the wavelength $\lambda$ of a standing wave occurring in the lowest-order resonance. On the horizontal axis, W1=0 represents the case where the back-side metal film 10b is not provided, i.e., the case where the dielectric of the dielectric cap 3 is exposed throughout the entire surface in the cavity. Further, the maximum value of W1 is W1=$\lambda/4$ and represents the case where the back-side metal film 10b on the cavity side covers the entire surface without an opening portion.

Figure 9B:
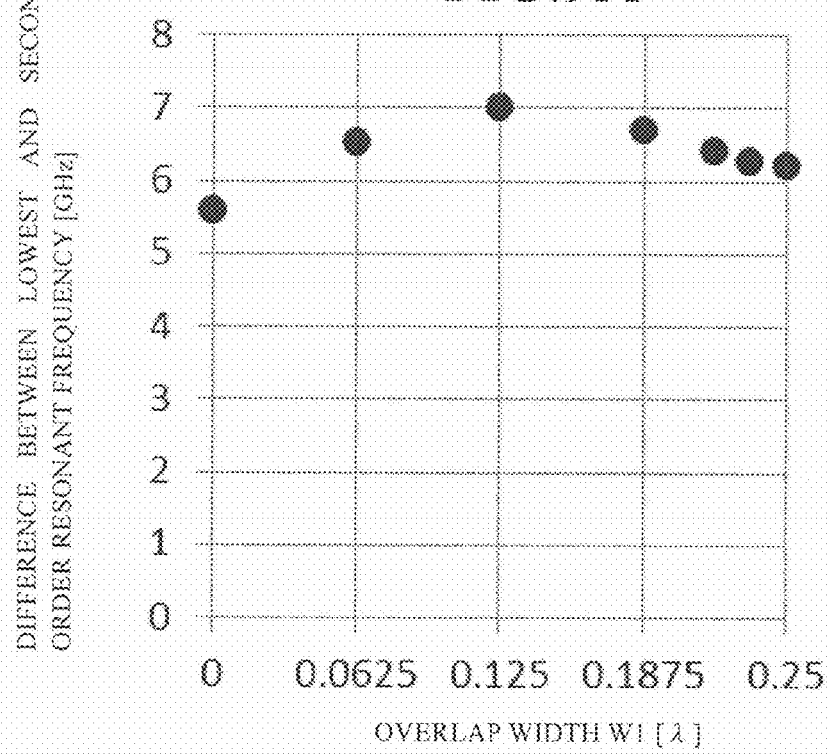
FIG. 9B shows an example of calculation about a change in the difference between lowest-order and second-order cavity resonant frequencies caused by a change in the overlap width W1 between the back-side metal film of the dielectric cap and the cavity.

From FIG. 9A, when W1=0, i.e., when the back-side metal film 10b does not exist, the cavity resonant frequency is shifted to a lowest frequency. The lowest-order cavity resonant frequency is approximately constant until the overlap width W1 reaches $\lambda/8$, and starts rising gradually when the overlap width W1 exceeds $\lambda/8$. Meanwhile, the second-order resonant frequency is gradually shifted to higher frequencies from a stage at which the back-side metal film 10b is inserted. FIG. 9B is obtained by plotting the difference between lowest-order and second-order cavity resonant frequencies with respect to the overlap width W1. In the case where the structure of the dielectric cap 3 of embodiment 1 is employed, the frequency difference is maximum when W1=$\lambda/8$, and it can be seen that the resonant frequency difference is large even in the range of W1=$\lambda/16$ (=0.0625) to W1=$3\lambda/16$ compared to that when W1=0 and W1=$\lambda/4$.

Next, differences between a conventional example and embodiment 1 will be described. For example, in the case where the back-side metal film 10b covers the entire surface on the cavity side in a high-frequency package used in the 14 GHz band (in the case where W1=$\lambda/4$), if the lowest cavity resonant frequency is 14.5 GHz as shown in FIG. 9A, a method has conventionally been used in which the resonant frequency is lowered to 12 GHz by eliminating the back-side metal film 101) of the dielectric cap 3 (W1=0) in order to shift the resonant frequency from the 14 GHz band, thus enabling usage at the 14 GHz. However, in this case, the second-order cavity resonant frequency is lowered to 17.5 GHz as shown in FIG. 9A, and usage in a wide band of 12 GHz to 18 GHz, which is a target, cannot be expected. Meanwhile, in the structure of embodiment 1, usage in a wide band of 12 GHz to 18 GHz can be realized by providing the back-side metal film 10b such that the center of the back-side metal film 10b approximately coincides with the center of the dielectric cap 3 and employing a dimension W1=$\lambda/16$ to $3\lambda/16$.

Further, effects obtained in the case where the back-side metal film 10b is connected to the front-side metal film 9 with the plurality of vias 11. Table 1 shows an example of calculation for the case where the back-side metal film 10b is connected to not the front-side metal film 9 but four corners of the back-side metal film 10a with a metal film in FIG. 6. This structure is similar to that of FIG. 1 of Japanese Patent Application Publication No. H9-148470. Meanwhile, table 2 shows results of calculation for the case where the back-side metal film 10b cover the entire surface (W1=$\lambda/4$) in FIG. 6. Since the back-side metal film 10b covers the entire surface, the permittivity of the dielectric cap 3 has no effect on the results of calculation. A first difference between the dielectric caps 3 calculated in tables 1 and 2 is whether or not the back-side metal film 10b is electrically connected to the front-side metal film 9 with the plurality of vias 11. Moreover, a second difference is that four corners of the back-side metal film 10b and four corners of the back-side metal film 10a are electrically connected, respectively, without electrical connection to the front-side metal film 9 through the vias 11 in table 1.

TABLE 1

| Characteristic mode | Frequency [GHz] | Note |
| --- | --- | --- |
| 1 | 3.7 | Unnecessay mode in dielectric cap |
| 2 | 7.1 | ↑ |
| 3 | 7.5 | ↑ |
| 4 | 9.3 | ↑ |
| 5 | 10.8 | ↑ |
| 6 | 12.0 | ↑ |
| 7 | 12.2 | ↑ |
| 8 | 12.5 | ↑ |
| 9 | 13.0 | TE101 modë |
| 10 | 15.1 | Unnecessay mode in dielectric cap |
| 11 | 15.2 | ↑ |
| 12 | 15.5 | ↑ |
| 13 | 15.6 | ↑ |
| 14 | 15.9 | ↑ |
| 15 | 16.0 | ↑ |
| 16 | 16.3 | ↑ |
| 17 | 17.6 | ↑ |
| 18 | 17.7 | ↑ |
| 19 | 19.4 | ↑ |
| 20 | 19.9 | ↑ |
| 21 | 20.2 | TE201 Mode |

TABLE 2

| Characteristic mode | Frequency [GHz] | Note |
| --- | --- | --- |
| 1 | 14.3 | TE101 mode |
| 2 | 22.3 | TE201 mode |

Table 1 shows an example of calculation for the case where four corners of the back-side metal film 10b are not respectively connected to the front-side metal film 9 but to four corners of the back-side metal film 10a using a metal film in FIG. 6 and where W1=λ/8. Table 2 shows an example in which resonant frequencies are calculated for the case where W1=λ/4 in FIG. 6.

From table 2, compared to the cavity resonant frequency for the TE101 mode for the case where the cavity is surrounded by metal, in the case of a metal film having an opening formed in a portion thereof shown in table 1, the cavity resonant frequency for the mot mode in table 1 is decreased from 14.3 GHz to 13 GHz by approximately 1.3 GHz by the influence of the permittivity of the dielectric cap 3. As described previously, a method in which an opening is provided in a metal film to expose a dielectric can shift a cavity resonant frequency in the case where a package is used in the 14 GHz band, and it can be seen that this method is one of practically effective methods for avoiding the influence of resonance.

However, it can be seen that as shown in table 1, a large number of resonant frequencies specific to outside dimensions of the dielectric cap itself appear due to the existence of a dielectric-exposed portion (opening portion) in the dielectric cap surrounded by a metal film and are distributed even in the vicinity of the operation frequency band, e.g., the 14 GHz band. Moreover, the frequency for the TE201 mode which is one order higher than the TE101 mode is also decreased from 22.3 GHz in table 2 to 20.2 GHz in table 1. It can be seen that the occurrence of additional resonant frequencies in the dielectric cap and a decrease in the frequency for the TE201 mode described above are hindrances to usage in a wide band of, for example, 14 GHz to 18 GHz. Meanwhile, as shown in FIG. 9A and FIG. 9B, in the case where the dielectric cap structure of embodiment 1 is used, undesired resonance does not occur in the dielectric cap, and the gap between lowest-order and second-order cavity resonant frequencies is widened. Accordingly, usage in a wide hand of 12 GHz to 18 GHz becomes possible.

(Relationship between Resonant Frequencies and Vias)

Figure 10A:
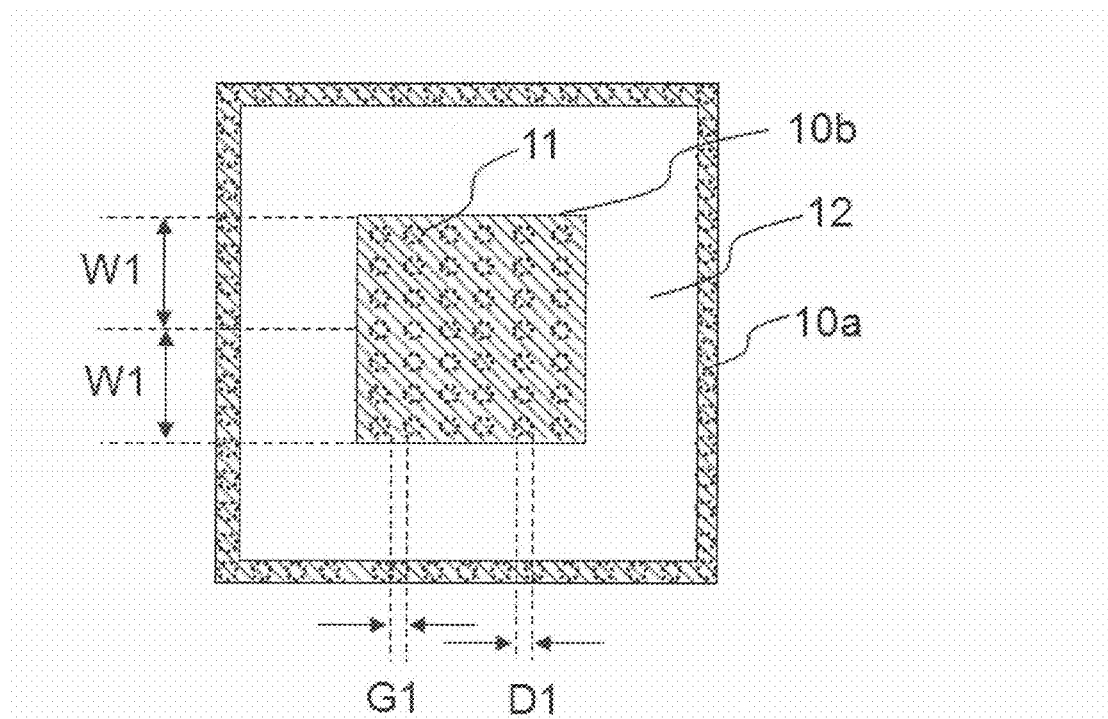
FIG. 10A is a plan view showing the relationship between the via spacing for the cavity resonant frequency and total area of vias.
Figure 10B:
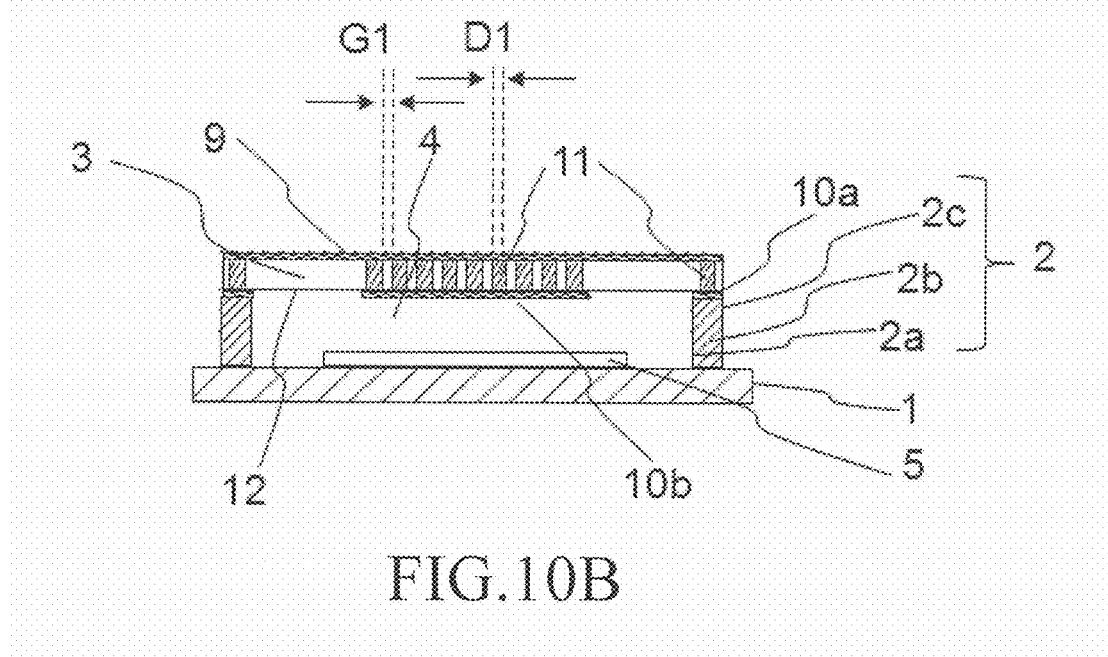
FIG. 10B is a cross-sectional view showing the relationship between the via spacing for the cavity resonant frequency and total area of vias.

Next, the relationship between resonant frequencies and vias in the package structure according to embodiment 1 is shown in FIG. 10. In FIG. 10, G1 denotes the spacing between adjacent vias, and D1 denotes the diameter of a via. Moreover, table 3 lists the relationship between the second-order cavity resonant frequency (f2) and the via spacing G1, the relationship between the resonant frequency (fr) in the dielectric cap and the second-order cavity resonant frequency (f2), and the relationship between the total area (Sv) of the vias 11 on the back-side metal film 10b and the area of the back-side metal film (S10b) which have been revealed by calculation.

Table 3 shows the spacing G1 between the vias 11 and the ratio (Sv/S10b) of the total area of the vias 11 to the total area of the back-side metal film 10b, which are conditions necessary for the lowest-order resonant frequency occurring in the dielectric cap 3 to be higher than a second-order cavity resonant frequency required for wide-band operation as shown in table 1 in the package structure according to embodiment 1. In table 3, f2 denotes the second-order cavity resonant frequency, fr denotes the lowest-order resonant frequency occurring in the dielectric cap 3, c denotes the velocity of light in vacuum, Sv denotes the total cross-sectional area of the vias connecting the metal film 10b and the metal film 9, and S10b denotes the area of the metal film 10b.

A condition for the lowest-order resonant frequency fr in the dielectric cap 3 to be higher than the second-order resonant frequency f2 found out for various via spacings G1 by electromagnetic computation is the expression of condition 1 in table 3. The expression of condition 1 can be explained by analogy with the fact that the lowest-order resonant frequency in the cavity surrounded by metal relates to λ/2, and therefore seems to be theoretically correct.

Further, in this calculation, it was also found that the lowest-order resonant frequency fr in the dielectric cap 3 becomes higher than the second-order cavity resonant frequency f2 if the total area Sv of the vias 11 is not less than 2% of the area S10b of the back-side metal film 10b. This condition is condition 2 in table 3. Accordingly, fr can be made higher than f2 by satisfying conditions 1 and 2.

TABLE 3

| Condition | Relationship between lowest-order resonant frequency (fr) in dielectric cap and second-order cavity resonant frequency (f2) | fr > f2 |
| --- | --- | --- |
| 1 | Relationship between metal spacing (G1) of vias 11 and second-order resonant frequency (f2) (c is the velocity of light in vacuum, and $\varepsilon_r$ is relative permittivity of dielectric cap) | $G1 < c/ [(\varepsilon_r)^{1/2} \cdot f2 \cdot 2]$ |
| 2 | Area ratio (Sv/S10b) of total area (Sv) of vias to area (S10b) of back-side metal film 10b | >2% |

For example, to prevent resonance in a ceramic cap at 18 GHz or less, G1<1.4 mm is obtained for f2=18 GHz and $\varepsilon_r$=9. Accordingly, if the back-side metal film 10b and the front-side metal film 9 are connected using the plurality of vias with a spacing of 1.4 mm or less between the vias 11, resonance caused by the dielectric cap can be made higher than the frequency range of 12 GHz to 18 GHz which is a target. Further, at this time, if the total area (Sv) of the vias 11 is not less than 2% of the area S10b of the back-side metal film, the lowest-order resonant frequency fr in the dielectric cap 3 can be made higher than the second-order cavity resonant frequency f2.

Figure 11A:
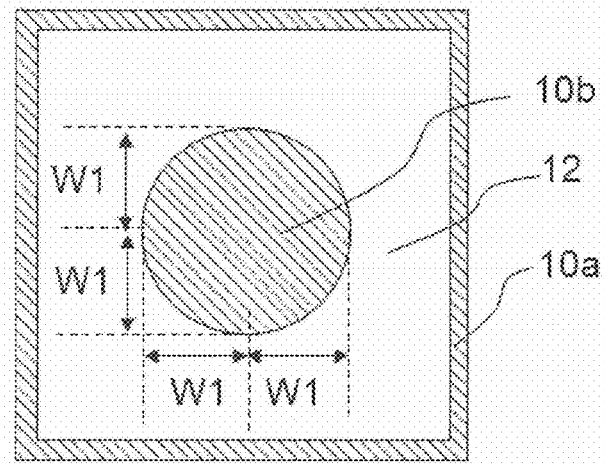
FIG. 11A shows the circular back-side metal film of the dielectric cap.
Figure 11B:
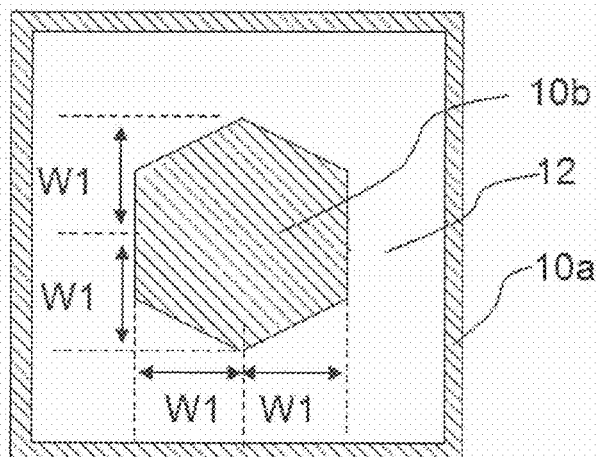
FIG. 11B shows the hexagonal back-side metal film of the dielectric cap.
Figure 11C:
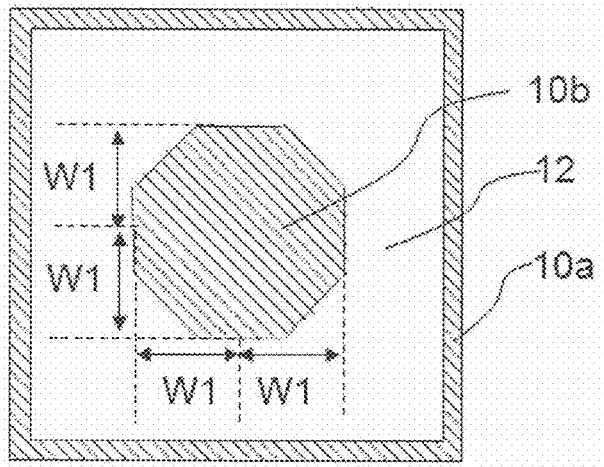
FIG. 11C shows the octagonal back-side metal film of the dielectric cap.

FIG. 11 is a modified example of the back-side metal film 10b of the dielectric cap according to embodiment 1. FIG. 11A is a circular example, FIG. 11B is a hexagonal example, and FIG. 11C is an octagonal example. For simplicity, vias are omitted. In the circular example, at W1=λ/8 shown in FIG. 9A, the lowest-order frequency decreases by approximately 0.1 GHz, and the second-order frequency increases by approximately 0.1 GHz. Accordingly, the difference between the two frequencies in FIG. 9B becomes approximately 0.2 GHz larger than that of the square example. Thus, in polygonal examples such as an octagonal or hexagonal example close to a circular example, the effect of increasing the frequency difference can be expected to be close to that of the circular example. Moreover, in this example, for simplicity of calculation, an example has been shown in which the overlap width W1 is the same for both depth and width. However, if one side is W1 and other side is W1 or more, a similar effect can be obtained in a rectangular or oval example.

Effects of Embodiment 1

As described above, a high-frequency package including the dielectric cap according to embodiment 1 has the effect of widening a band width of the package by increasing the difference between lowest-order and second-lowest-order cavity resonant frequencies specific to the package while realizing complete electromagnetic shielding with a metal film covering the front side of the dielectric cap and a reduction in undesired resonances occurring in the dielectric cap.

Embodiment 2

(Explanation of Structure)

Figure 12:
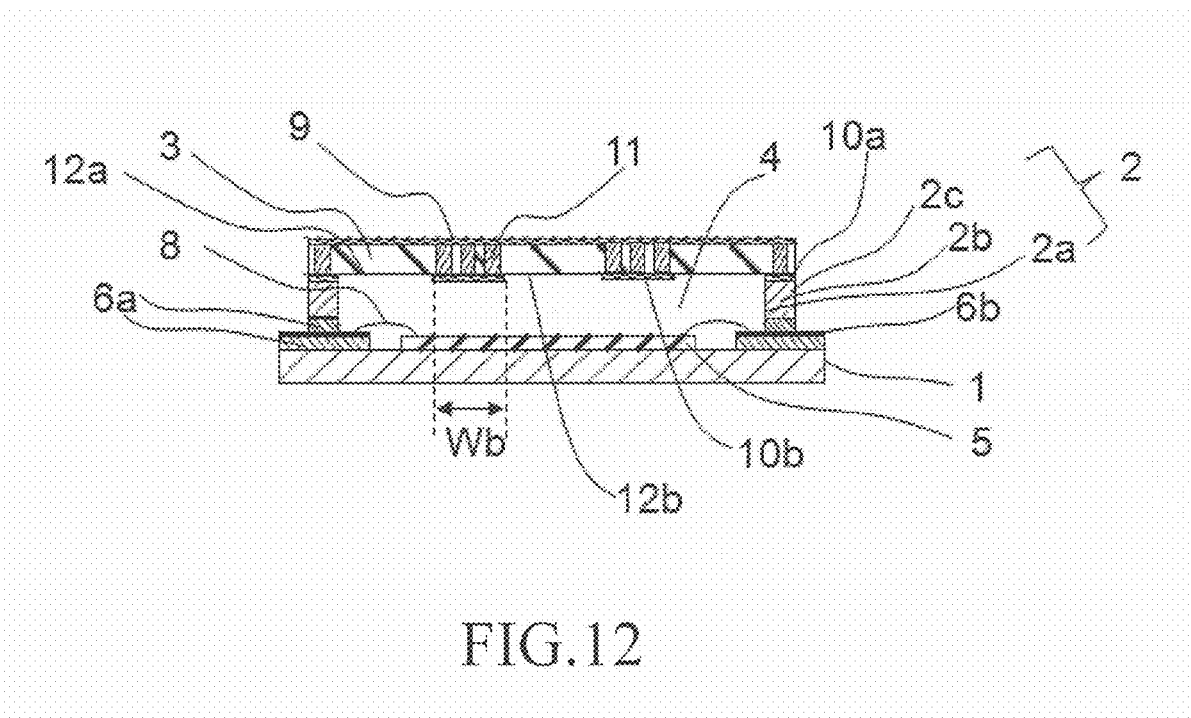
FIG. 12 is a cross-sectional view of a high-frequency package of embodiment 2.
Figure 13:
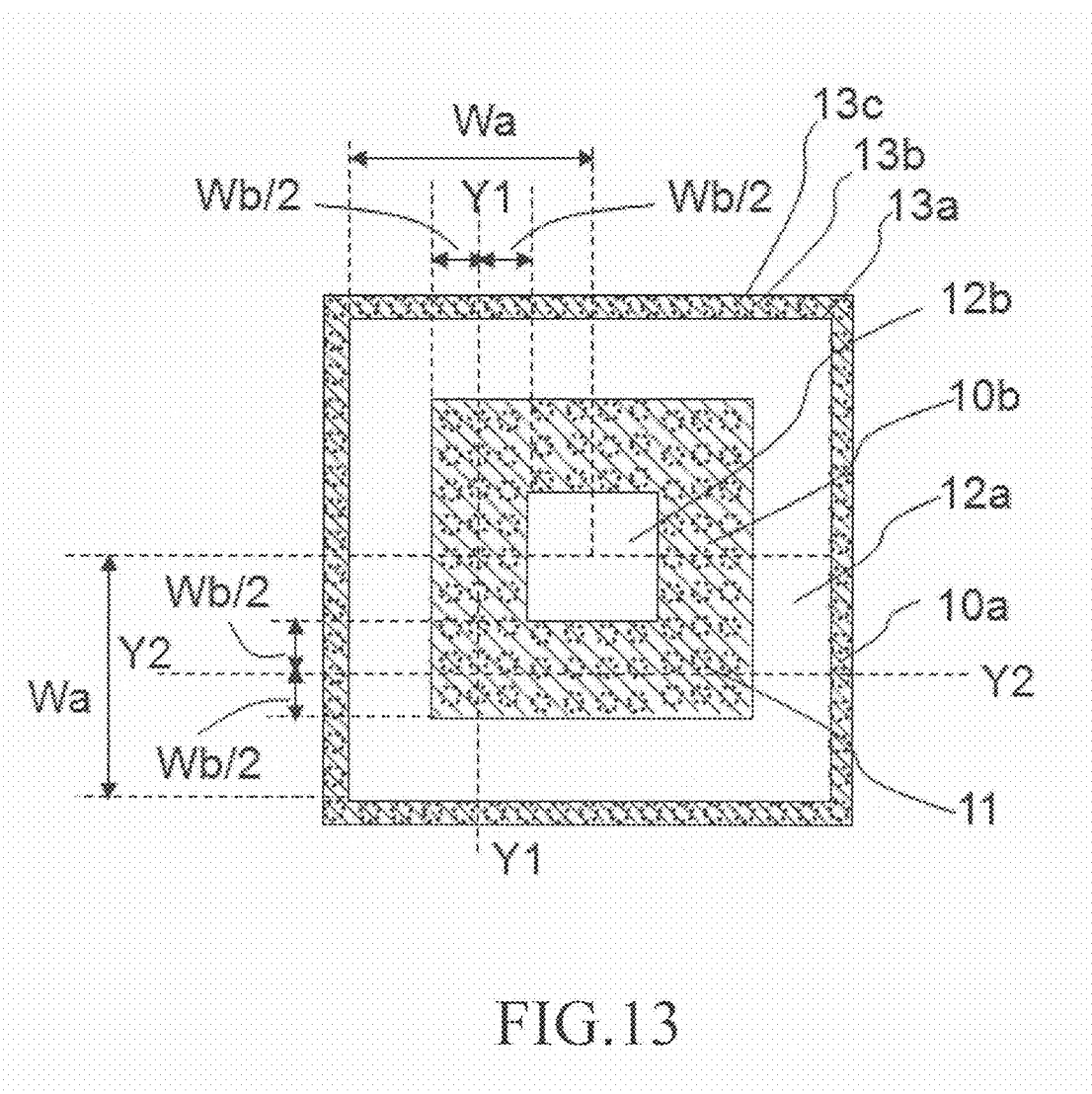
FIG. 13 is a plan view of back-side of a dielectric cap according to embodiment 2.

FIG. 12 is a cross-sectional view showing a high-frequency package of embodiment 2 of the present invention, and FIG. 13 is a plan view of back-side metal films of a dielectric cap according to embodiment 2. In FIG. 13, 13a denotes a portion of the metal film 10a which comes in contact with the side wall inner surface 2a when attached to the dielectric cap 3, 13b denotes a portion of the metal film 10a which comes in contact with the side wall inner portion 2b, and 13c denotes a portion of the metal film 10a which comes in contact with the side wall outer surface 2c.

As shown in FIGS. 12 and 13, the back-side metal film 10b formed on the same side as the back-side metal film 10a has a dielectric-exposed portion (opening portion) 12b, and is therefore doughnut-shaped (referred to as strip-shaped here) with respect to the center of the dielectric cap 3. Further, the back-side metal film 10b is electrically connected to the front-side metal film 9 with the plurality of vias 11 as in embodiment 1. A difference from embodiment 1 is that the back-side metal film has an opening portion 12b. Another dielectric-exposed portion 12a is formed in a peripheral portion of an inner surface of the dielectric cap.

(Operation)

Figure 14A:
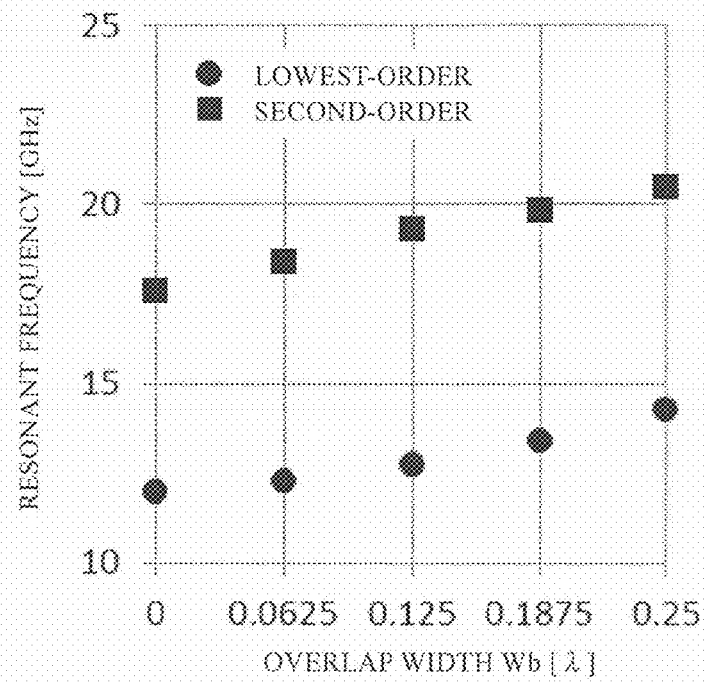
FIG. 14A shows an example of calculation about a change in the cavity resonant frequency caused by a change in the overlap width Wb between the back-side metal film of the dielectric cap and the cavity.

FIG. 14A shows an example of calculation of lowest-order and second-order cavity resonant frequencies for varying overlap width Wb between the strip-shaped conductor portion 10b of the dielectric cap 3 and the cavity 4. Here, package dimensions are the same as those of the example (FIG. 9) of calculation of embodiment 1. Moreover, as shown in FIGS. 12 and 13, with regard to the overlap width Wb, centers (line Y1-Y1 and line Y2-Y2) of the rectangular strip-shaped metal film 10b are located at positions shifted from the center of the dielectric cap 3 perpendicularly toward the side wall inner surface 2a by a distance equal to half the distance between the center of the cap 3 and the side wall inner surface 2a. Accordingly, the strip-shaped back-side metal film 10b is disposed such that a highest electric field portion of the second-order cavity resonance overlaps a central portion of the width thereof.

Figure 14B:
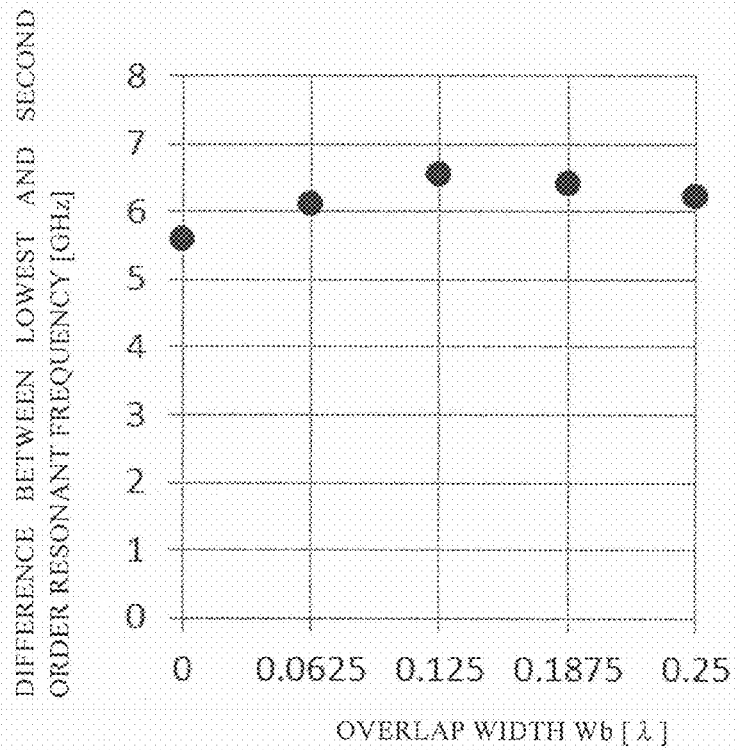
FIG. 14B shows an example of calculation about a change in the difference between lowest-order and second-order cavity resonant frequencies caused by a change in the overlap width Wb between the back-side metal film of the dielectric cap and the cavity.

In FIG. 14A, the overlap width Wb is varied by the same width on both sides of a central portion of the width of Wb. In FIG. 14A, the horizontal axis is the overlap width Wb between the strip-shaped metal film 10b and the cavity 4, and Wb is normalized by the wavelength λ of a standing wave occurring in the lowest-order resonance. In the drawing, when Wb=λ/4, the entire contact surface between the cavity 4 and the dielectric cap 3 is covered with a metal film. When Wb=0, the strip-shaped back-side metal film 10b is not provided, and the dielectric on the back side is fully exposed as in FIG. 6 of embodiment 1. Compared to FIG. 9B, the maximum value of the frequency difference in FIG. 14B is slightly low, but the change of the frequency difference with respect to the overlap width Wb is gradual accordingly.

Figure 15A:
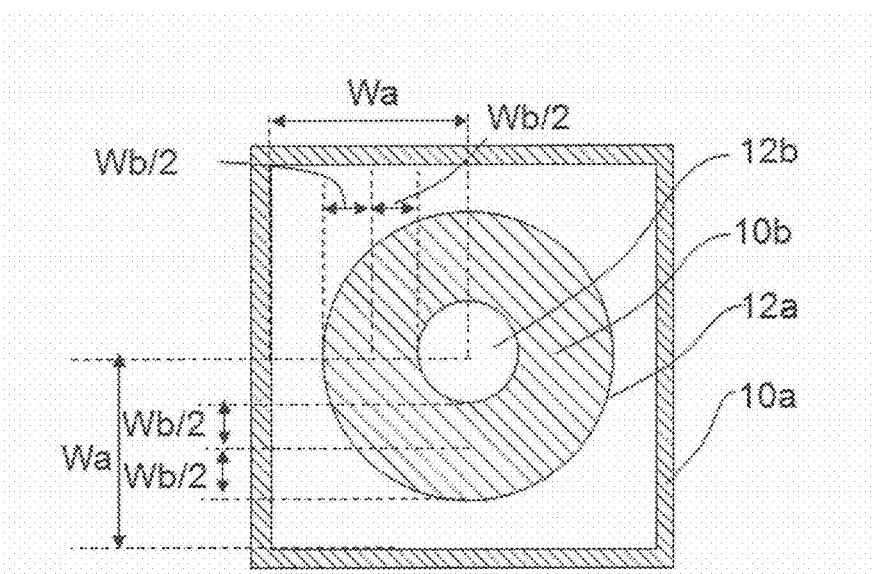
FIG. 15A shows the circular back-side metal film of the dielectric cap.
Figure 15B:
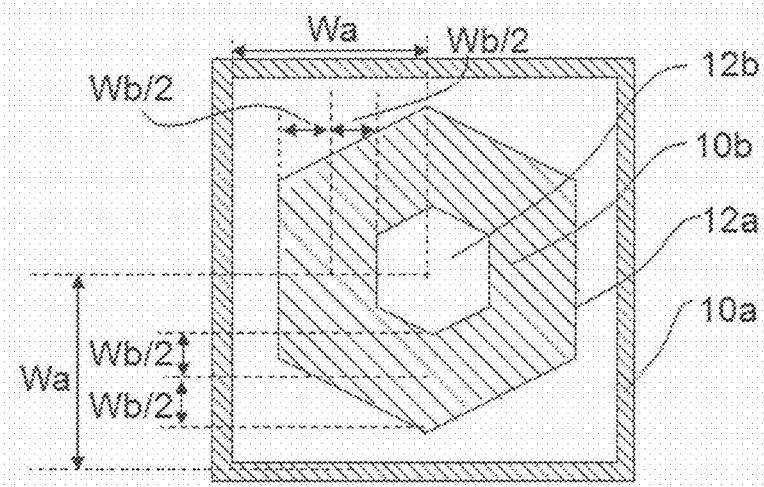
FIG. 15B shows the hexagonal back-side metal film of the dielectric cap.
Figure 15C:
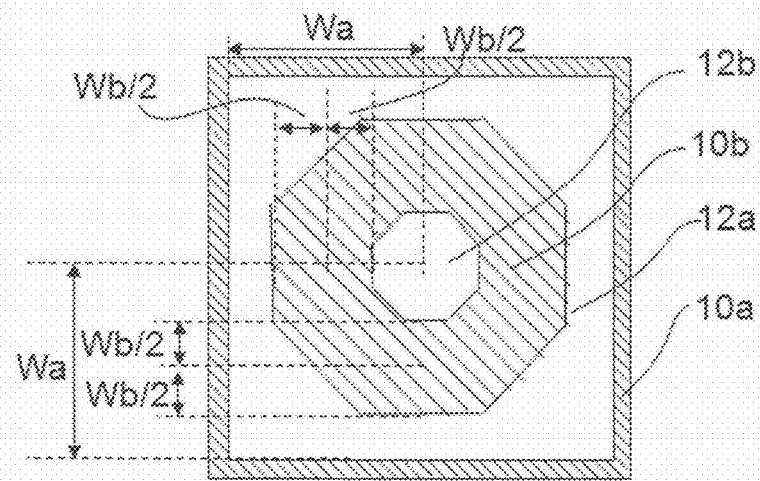
FIG. 15C shows the octagonal back-side metal film of the dielectric cap.

FIG. 15 is a modified example of the back-side metal film 10b of the dielectric cap according to embodiment 2. FIG. 15A is a circular example, FIG. 15B is a hexagonal example, and FIG. 15C is an octagonal example. For simplicity, vias are omitted. In any of these examples, as in embodiment 1 in which the circular example has a larger frequency difference than the square example, the effect of obtaining a frequency difference slightly larger than the effect shown in the square example of FIG. 14 can be expected. Moreover, in this example, for simplicity of calculation, an example has been shown in which the overlap width W1 is the same for both depth and width. However, if one side is Wb, a similar effect can be obtained in a polygonal or oval example.

Effects of Embodiment 2

As described above, in the high-frequency package according to embodiment 2, since a shift amount of resonant frequency with respect to the overlap width Wb is gradual, the effect of reducing variation in resonant frequency relating to variation in the width of the metal film 10b can be obtained in addition to the effects of embodiment 1.

Embodiment 3

Figure 16:
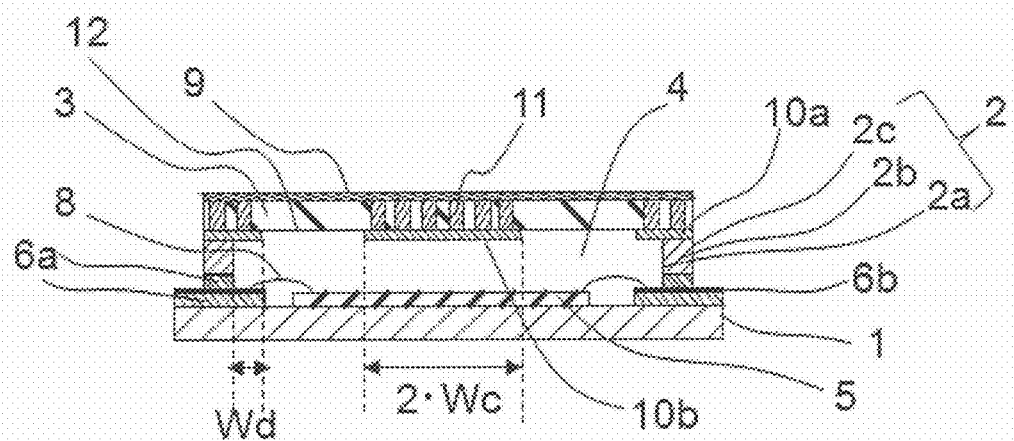
FIG. 16 is a cross-sectional view showing a high-frequency package according to embodiment 3.
Figure 17:
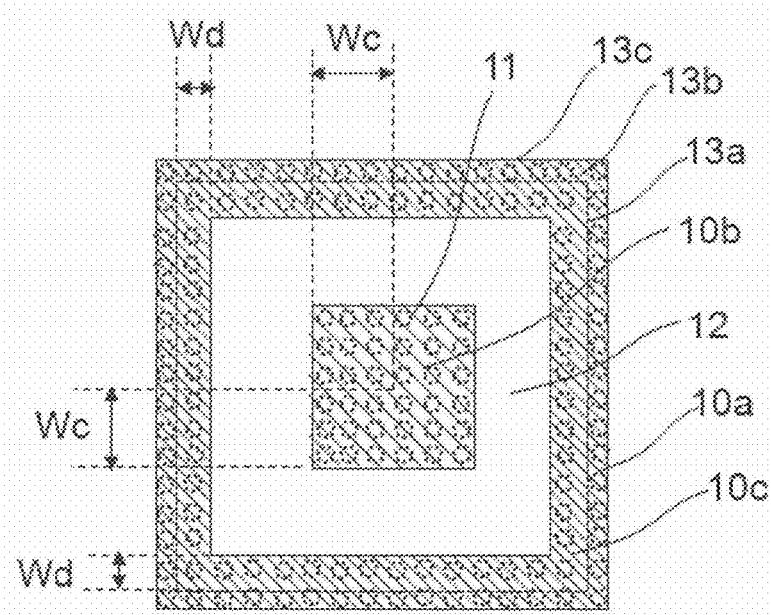
FIG. 17 is a plan view of back-side of the dielectric cap according to embodiment 3.

FIG. 16 is a cross-sectional view showing a high-frequency package according to embodiment 3 of the present invention, and FIG. 17 is a plan view of back-side metal films of the dielectric cap 3 according to embodiment 3. Differences from FIG. 6 of embodiment 1 are as follows: an outer circumference of a back-side metal film fully contacts the back-side metal film 10a contacting the side wall 2 on the dielectric cap hack side; and an inner circumference thereof protrudes in the shape of a frame toward the center of the dielectric cap 3. Reference sign 10c in FIGS. 16 and 17 denotes the protruding portion of the back-side metal film.

(Operation)

Figure 18A:
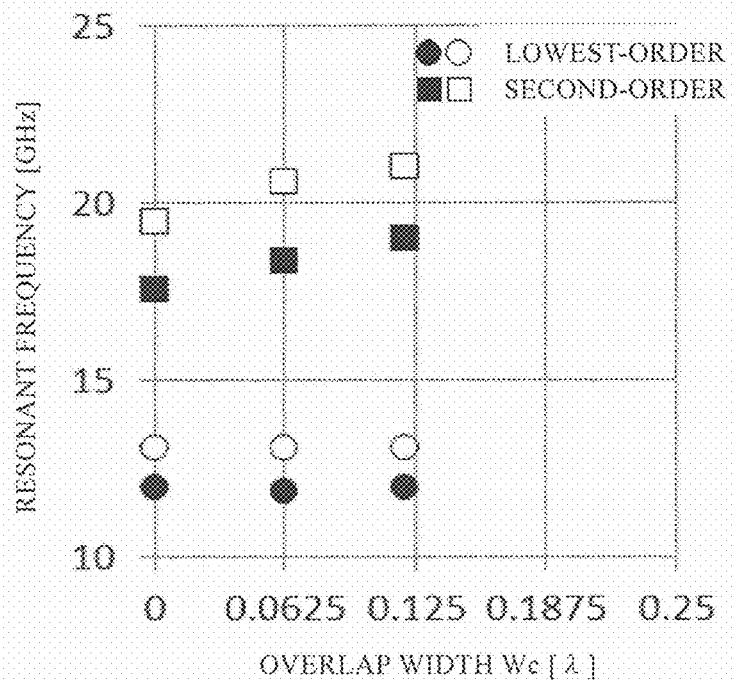
FIG. 18A shows an example of calculation about a change in the cavity resonant frequency caused by a change in the overlap width Wc between the back-side metal film of the dielectric cap and the cavity.

FIG. 18A shows an example in which the change of ca resonant frequency for varying overlap width Wc (perpendicular length from the center of the dielectric cap 3, i.e., a highest electric field portion in the lowest-order resonance, to each side wall 2) between the conductor 10b of the dielectric cap 3 and the cavity 4 is calculated using the overlap width Wd between the metal film 10c and the cavity 4 as a parameter, Package dimensions are the same as those of embodiment 1. In the drawing, closed circles and open circles represent lowest-order resonant frequencies, and closed squares and open squares represent second-order cavity resonant frequencies. The horizontal axis represents the overlap width Wc between the metal film 10b and the cavity 4, and Wc is normalized by the wavelength λ of a standing wave occurring in the lowest-order resonance. Moreover, closed circles and closed squares are results of calculation for the case where the overlap width Wd between the metal film 10c and the cavity 4 is 0, and open circles and open squares are results of calculation for the case where the overlap width Wd is λ/16 (≈2 mm).

Figure 18B:
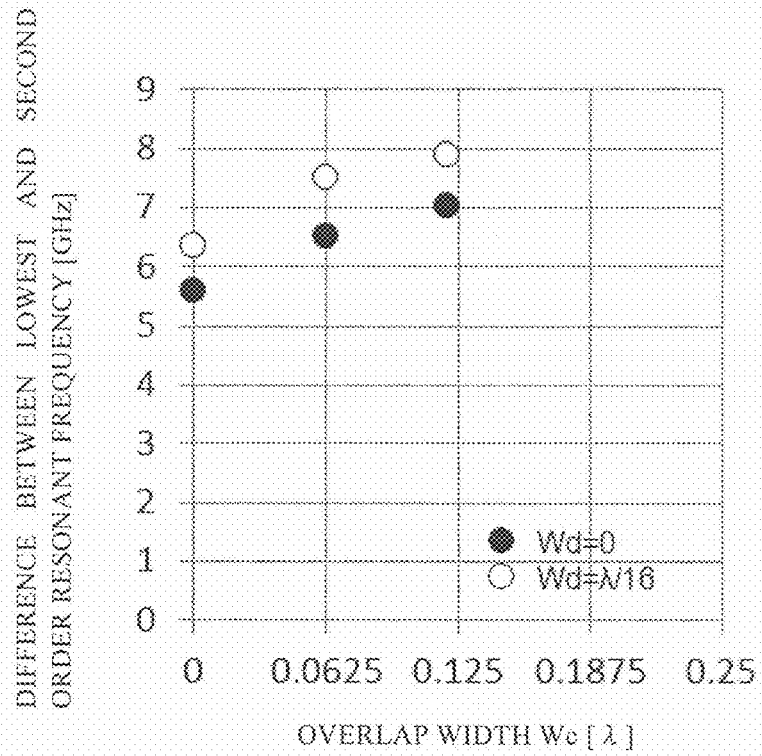
FIG. 18B shows an example of calculation about a change in the difference between lowest-order and second-order cavity resonant frequencies caused by a change in the overlap width Wc between the back-side metal film of the dielectric cap and the cavity.

The maximum value of the perpendicular length from the center of the dielectric cap 3 to each surface of the side wall 2 is equal to the distance from a node to an antipode of the above-described standing wave and expressed as λ/4. As described in embodiment 2, with the metal film 10b disposed to cover a highest electric field portion of the lowest-order resonance, when the overlap width Wc is λ/8, the lowest-order cavity resonant frequency is shifted to a lowest frequency, and the difference from the second-order cavity resonant frequency becomes maximum. If the width Wd of the protruding portion 10c of the metal film is varied when Wc=λ/8, the lowest-order and second-order resonant frequencies are shifted to higher frequencies. However, since the change of the second-order resonant frequency is slightly larger than the change of the lowest-order resonant frequency, the difference between resonant frequencies is slightly increased by the provision of the metal film 10c as shown in FIG. 18B. Accordingly, a package having a wider band than that of embodiment 1 can be provided.

Figure 19A:
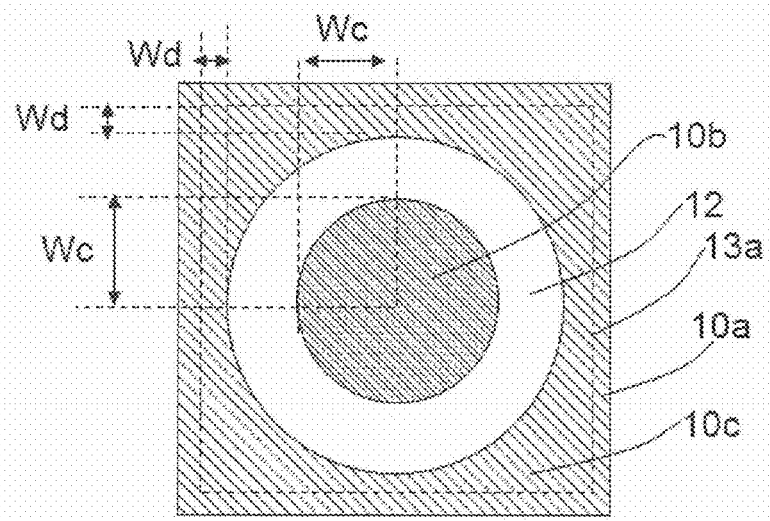
FIG. 19A shows the circular back-side metal film of the dielectric cap.
Figure 19B:
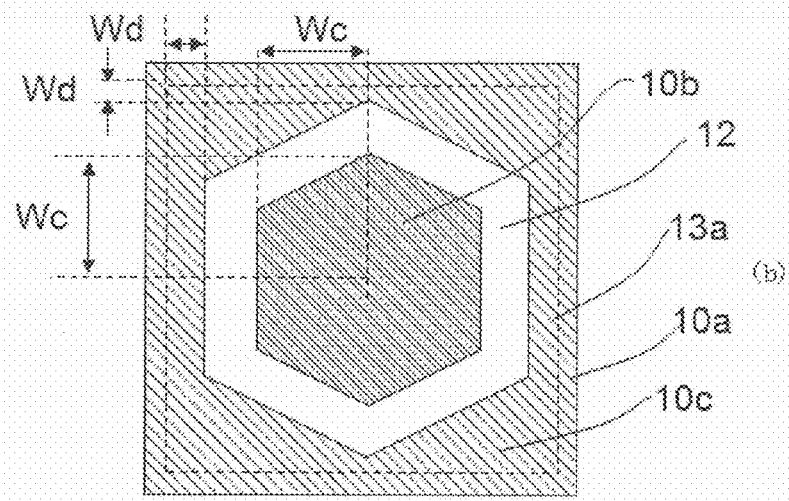
FIG. 19B shows the hexagonal back-side metal film of the dielectric cap.
Figure 19C:
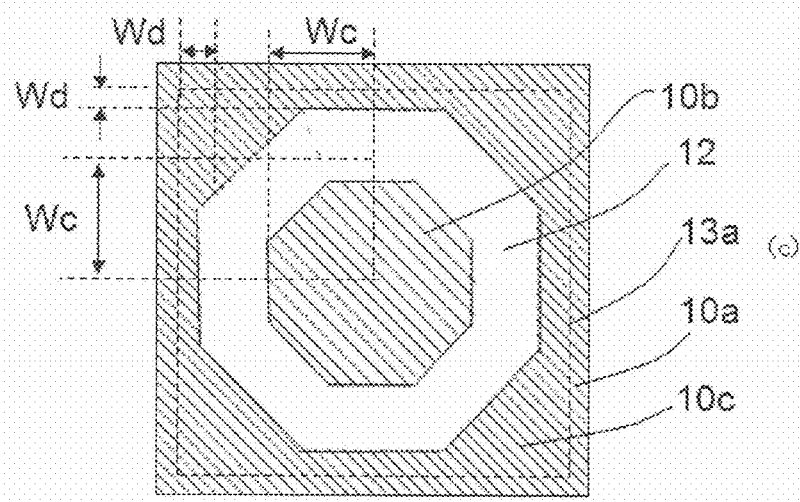
FIG. 19C shows the octagonal back-side metal film of the dielectric cap.

FIG. 19 is a modified example of the back-side metal films 10b and 10c of the dielectric cap according to embodiment 3. FIG. 19A is a circular example, FIG. 19B is a hexagonal example, and FIG. 19C is an octagonal example. For simplicity, vies are omitted. In any of these examples, as described in the modified examples of embodiments 1 and 2, the effect of increasing the difference between lowest-order and second-order frequencies compared to that in the square example can be expected. Moreover, in this example, for simplicity of calculation, an example has been shown in which the overlap widths Wc and Wd are the same for both depth and width. However, a similar effect can be obtained in a polygonal or oval example.

Effects of Embodiment 3

As described above, in the high-frequency package according to embodiment 3, with the metal film 10c newly added to embodiment 1 and provided inward from the side wall, a package having a wider band than that of embodiment 1 can be provided, Other effects are the same as those of embodiment 1.

Embodiment 4

Figures 20A, 20B:
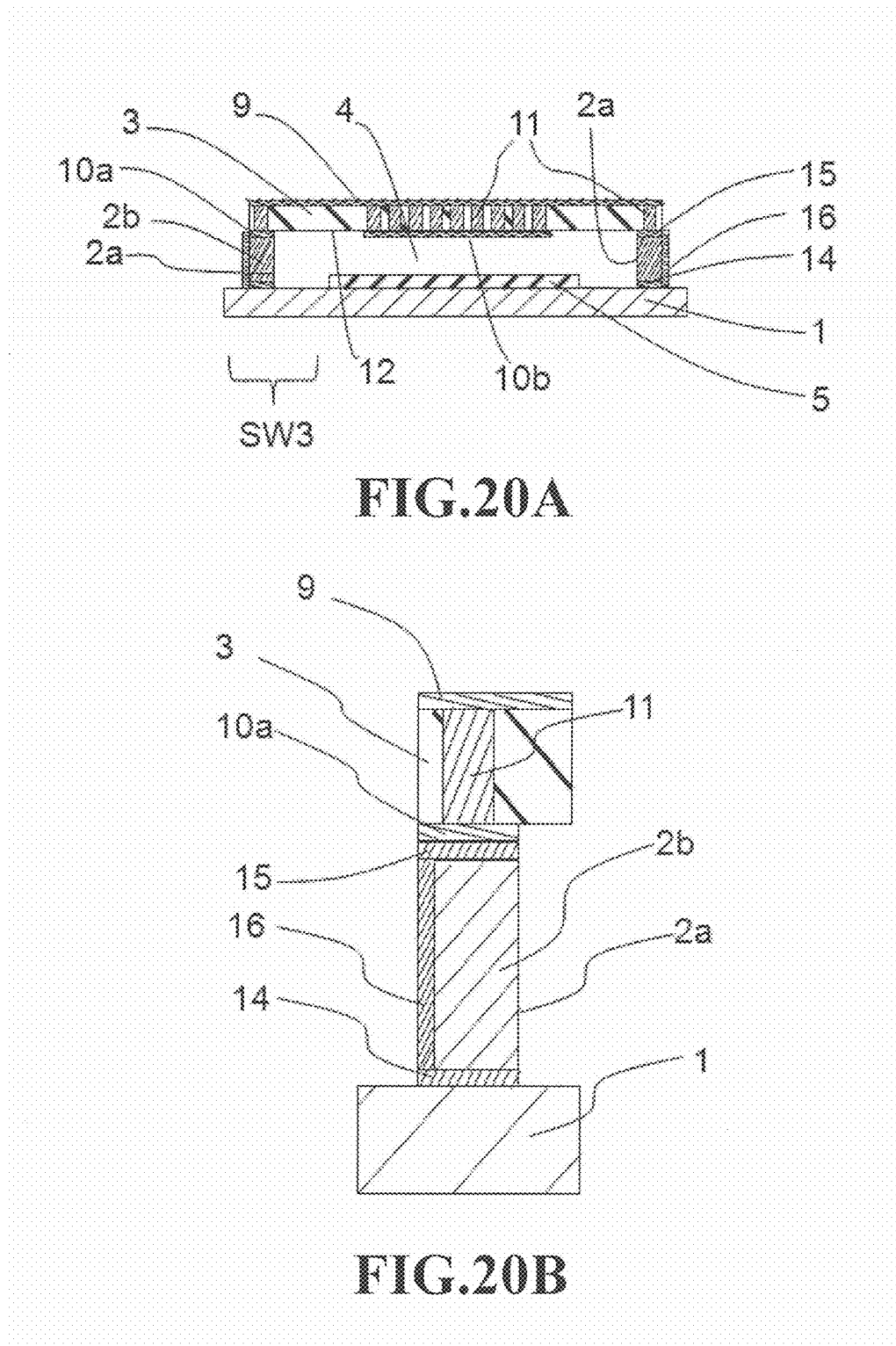
FIG. 20A is a cross-sectional view of high-frequency package of embodiment 4.
FIG. 20B is an enlarged view of part SW3.

FIG. 20A is a cross-sectional view of a high-frequency package according to embodiment 4 of the present invention, and FIG. 20B is an enlarged view of part SW3 in FIG. 20A. The cross-sectional view of FIG. 20A is a cross-sectional view along plane X2-X2 shown in the top view of FIG. 2. In the drawings, the side wall 2 is made of a dielectric such as a ceramic and connected to the conductor base plate 1 with a conductive adhesive or the like. Moreover, 15 denotes a conductor formed by plating or the like on a surface of an upper portion of the side wall 2 which comes in contact with the back-side conductor 10a of the dielectric cap 3, and the conductor 15 is also connected to the conductor 10a through a conductive adhesive or the like. Reference sign 16 denotes a conductor configured on a package outside surface of the side wall 2 by plating or the like to electrically connect the conductors 14 and 15. In other words, this is a side wall structure obtained by removing the vias 2e and attaching metal films to only the outer surface 2c, the upper surface 2f, and the lower surface 2g in FIG. 5D and FIG. 5E. Unlike embodiments 1 to 3, the conductor portion of the side wall 2 includes only the conductors 14, 15, and 16, Accordingly, boundary conditions of the cavity 4 with respect to the side wall 2 are different. Except for this, the structure is the same as that of embodiment 1.

(Operation)

Figure 21:
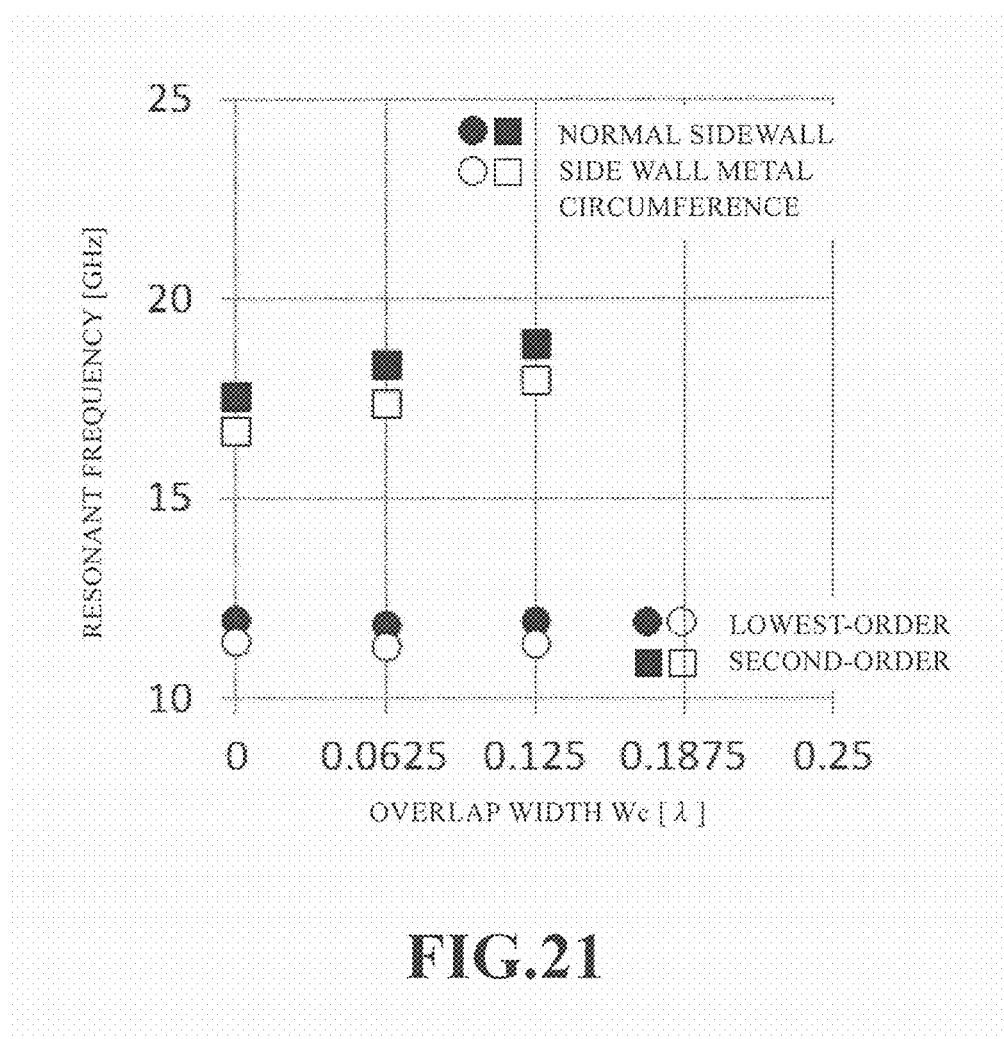
FIG. 21 shows the change of resonant frequency for varying overlap width. We where the closed circles and closed squares represent resonant frequencies of the high-frequency package of the foregoing embodiment 1, and open circles and open squares represent resonant frequencies of the high-frequency package of embodiment 4.

FIG. 21 shows the change of resonant frequency for varying overlap width W1 (perpendicular length from the center of the package, i.e., a highest electric field portion in the lowest-order resonance, to each side wall 2) between the back-side metal film 10b of the dielectric cap 3 of the high-frequency package according to embodiment 4 of the present invention and the cavity 4. In the drawing, open circles and closed circles represent lowest-order resonant frequencies, and open squares and closed squares represent next-order (second-order) resonant frequencies. Moreover, the horizontal axis represents the overlap width W1 between the metal film 10b and the cavity 4, and the value thereof is normalized by the wavelength λ of a standing wave occurring in the lowest-order resonance. Further, open circles and open squares represent resonant frequencies of the high-frequency package of this embodiment 4, and closed circles and closed squares represent resonant frequencies of the high-frequency package of the foregoing embodiment 1.

The resonant frequency of embodiment 4 shows a change similar to that of the resonant frequency of embodiment 1 with respect to the change of the overlap width W1, but the absolute values thereof can be made smaller than those of resonant frequency of embodiment 1 as a whole. This is because boundary conditions of the side wall are changed. Cavity resonant frequencies are usually determined by package dimensions, and these dimensions are determined by dimensions of a semiconductor element to be mounted, a matching circuit substrate, and the like, Although a band width can be widened by changing the structure of the dielectric cap in embodiments 1 to 3, this embodiment is effective in finely adjusting the frequency range.

Effects of Embodiment 4

As described above, in the high-frequency package according to embodiment 4, with the metal film 10c newly added to embodiments 1 to 3 and provided inward from the side wall, the range of lowest-order and second-order cavity resonant frequencies obtained in embodiments 1 to 3 can be shifted to lower frequencies overall. This is effective in adjusting the frequency range. Other effects are the same as those of embodiments 1 to 3.

A package for the microwave band and the millimeter wave band according to the present invention has the effect of widening a band width of the package by increasing the difference between lowest-order and second-lowest-order cavity resonant frequencies specific to the package while realizing complete electromagnetic shielding and a reduction in undesired resonances occurring in a dielectric cap with a metal film covering a front side of the dielectric cap.

Obviously many modifications and variations of the present invention are possible in the light of the above teachings. It is therefore to be understood that within the scope of the appended claims the invention may be practiced otherwise than as specifically described.

What is claimed is:

1. A microwave and millimeter wave package comprising:
   a conductor base plate having a semiconductor element fixed to an upper surface thereof;
   a side wall provided on the conductor base plate to surround the semiconductor element, the side wall having a conductor portion electrically connected to the conductor base plate;
   a dielectric cap disposed on the side wall to form an internal space together with the conductor base plate and the side wall;
   a front-side metal film provided on an entire front-side of the dielectric cap;
   a first back-side metal film provided on an inner surface of the dielectric cap such that a center of the first back-side metal film approximately coincides with a center of a surface of the dielectric cap which faces the conductor base plate; and
   a plurality of vias provided to pass through the dielectric cap and achieve electrical connection between the front-side metal film and the first back-side metal film and electrical connection between the front-side metal film and the conductor portion of the side wall, wherein
   the first back-side metal film has, in a plan view, any one of a rectangular shape, a circular shape, an oval shape, and a polygonal shape,
   the first back-side metal film comprises an opening portion in the first back-side metal film, the opening portion having a shape approximately similar to the shape of the first back-side metal film and having a small area, centers of the opening portion and the first back-side metal film approximately coinciding with each other, and
   a width of the first back-side metal film of the opening portion is in a range of 1/16 to 3/16 of the wavelength for the lowest-order cavity resonant frequency.

2. The microwave and millimeter wave package according to claim 1, further comprising:
   a second back-side metal film located on the inner surface of the dielectric cap to have an outer circumference portion contacting the side wall and an inner circumference portion protruding in a direction of a center of the dielectric cap,
   wherein the front-side metal film and the second back-side metal film are electrically connected through a plurality of vias.

3. The microwave and millimeter wave package according to claim 1, wherein
   a spacing G1 between the plurality of vias satisfies $G1 < c/[(\varepsilon_r)^{1/2} \cdot f2 \cdot 2]$ where $\varepsilon_r$ is a relative permittivity of the dielectric cap, c is a velocity of light in vacuum, and f2 is a resonant frequency which is one order higher than the lowest-order resonant frequency, and
   a ratio Sv/S of a total cross-sectional area Sv of the plurality of vias to an area S of the first back-side metal film is 2% or more.

4. The microwave and millimeter wave package according to claim 1, wherein the conductor portion of the side wall is provided on an outer surface of the side wall.

5. A microwave and millimeter wave package comprising:
   a conductor base plate having a semiconductor element fixed to an upper surface thereof;
   a side wall provided on the conductor base plate to surround the semiconductor element, the side wall having a conductor portion electrically connected to the conductor base plate;
   a dielectric cap disposed on the side wall to form an internal space together with the conductor base plate and the side wall, the dielectric cap having a substantially uniform thickness;
   a front-side metal film provided on an outer surface of the dielectric cap;
   a first back-side metal film provided on an inner surface of the dielectric cap such that a center of the first back-side metal film approximately coincides with a center of a surface of the dielectric cap which faces the conductor base plate; and
   a plurality of vias provided to pass through the dielectric cap and achieve electrical connection between the front-side metal film and the first back-side metal film and electrical connection between the front-side metal film and the conductor portion of the side wall, wherein
   the first back-side metal film has, in a plan view, any one of a rectangular shape, a circular shape, an oval shape, and a polygonal shape,
   the first back-side metal film comprises an opening portion in the first back-side metal film, the opening portion having a shape approximately similar to the shape of the first back-side metal film and having a small area, centers of the opening portion and the first back-side metal film approximately coinciding with each other, and
   a width of the first back-side metal film of the opening portion is in a range of 1/16 to 3/16 of the wavelength for the lowest-order cavity resonant frequency.

6. The microwave and millimeter wave package according to claim 5, wherein
   a spacing G1 between the plurality of vias satisfies $G1 < c/[(\varepsilon_r)^{1/2} \cdot f2 \cdot 2]$ where $\varepsilon_r$ is a relative permittivity of the dielectric cap, c is a velocity of light in vacuum, and f2 is a resonant frequency which is one order higher than the lowest-order resonant frequency, and
   a ratio Sv/S of a total cross-sectional area Sv of the plurality of vias to an area S of the first back-side metal film is 2% or more.

* * * * *